(12) United States Patent
Ootani et al.

(10) Patent No.: US 7,800,112 B2
(45) Date of Patent: Sep. 21, 2010

(54) SEMICONDUCTOR DEVICE COMPRISING MIM CAPACITOR

(75) Inventors: Itaru Ootani, Osaka (JP); Shinichiro Hayashi, Osaka (JP); Shinji Nishiura, Toyama (JP)

(73) Assignee: Panasonic Corporation, Osaka (JP)

( * ) Notice: Subject to any disclaimer, the term of this patent is extended or adjusted under 35 U.S.C. 154(b) by 42 days.

(21) Appl. No.: 12/257,700

(22) Filed: Oct. 24, 2008

(65) Prior Publication Data

US 2009/0108405 A1    Apr. 30, 2009

(30) Foreign Application Priority Data

Oct. 25, 2007   (JP)   ............... 2007-277300

(51) Int. Cl.
*H01L 27/108* (2006.01)
(52) U.S. Cl. ............... 257/68; 257/532; 257/E21.011; 257/E29.343; 257/414
(58) Field of Classification Search ......... 257/532, 257/414, E21.011, E29.343
See application file for complete search history.

(56) References Cited

U.S. PATENT DOCUMENTS

| | | | |
|---|---|---|---|
| 6,853,082 | B1 | 2/2005 | Chen et al. |
| 6,894,331 | B2 | 5/2005 | Yoshitomi et al. |
| 2007/0059919 | A1 | 3/2007 | Ooka |

FOREIGN PATENT DOCUMENTS

JP    2001-237375    8/2001

OTHER PUBLICATIONS

Steigerwold et al "Pattern Geometry Effects in the Chemical-Mechanical Polishing of Inlaid Copper Structures" J. Electrochem Soc. pp. 2842-2848 vol. 1411, No. 10 The Electrochemical Society Inc. Oct. 1994.

*Primary Examiner*—Bradley K Smith
*Assistant Examiner*—Mohammad T Karimy
(74) *Attorney, Agent, or Firm*—McDermott Will & Emery LLP

(57) ABSTRACT

A conductive film embedded in a predetermined region on an upper surface of an insulation film and metallic wirings embedded so as to penetrate through the conductive film and protrudes into the insulation film constitute a lower electrode of an MIM capacitor.

9 Claims, 21 Drawing Sheets

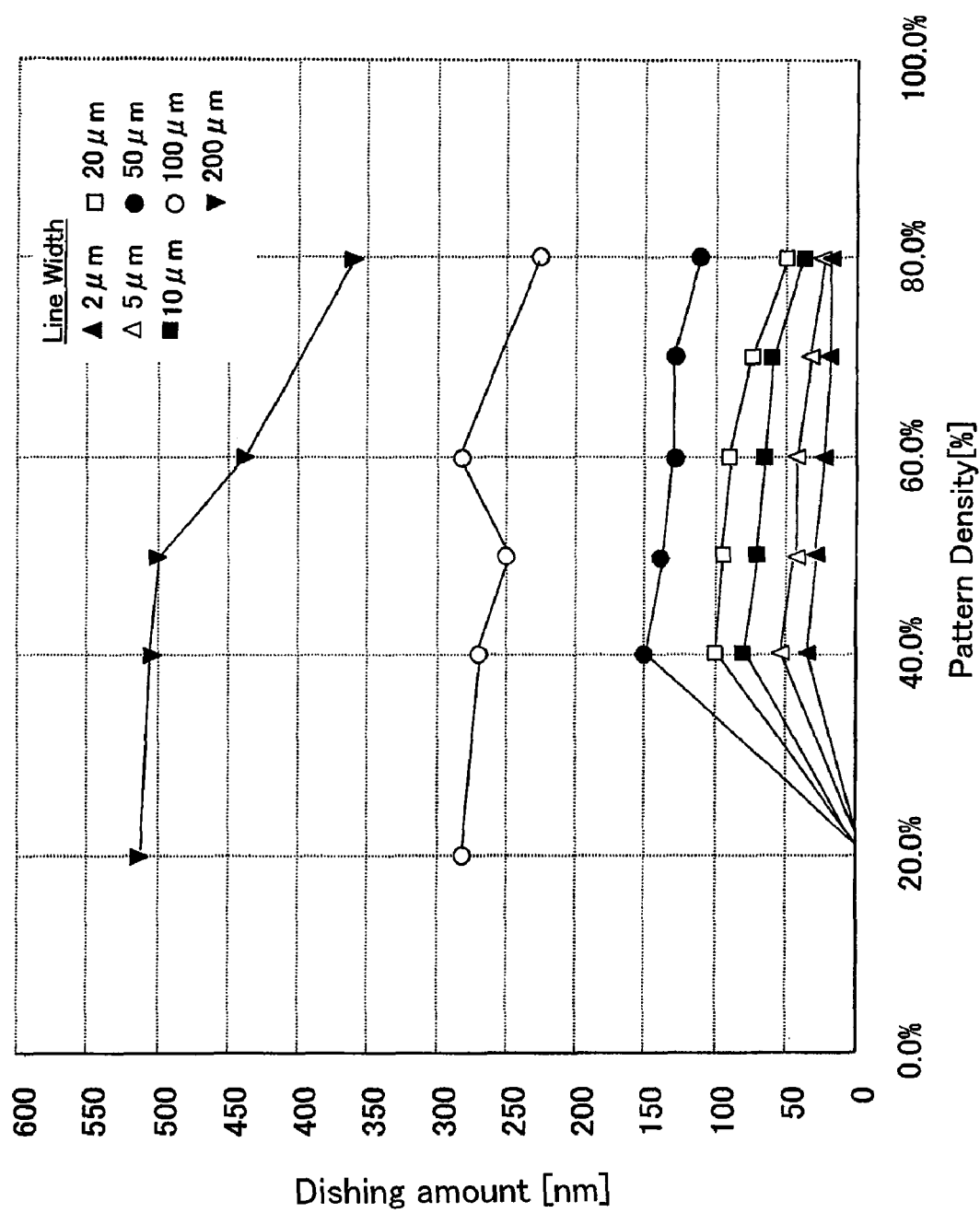
F I G. 21

SEMICONDUCTOR DEVICE COMPRISING MIM CAPACITOR

BACKGROUND OF THE INVENTION

1. Field of the Invention

The present invention relates to a semiconductor device comprising an MIM (Metal-Insulator-Metal) capacitor which is a capacitance element having such a metal-insulator-metal structure that a dielectric film is provided between two metallic layers and a method of manufacturing the semiconductor device.

2. Description of the Related Art

It is pursued in recent years to provide an analog device and a CMOS logic device on one chip, and the CMOS logic device is increasingly miniaturized from year to year. In the case where the gate length of a MOS transistor is at most approximately 0.1 μm, it is demanded that the wiring resistance be further reduced. Therefore, Cu (copper), which is a low-resistance material, is used as a material for a metallic wiring, and the damocene process has been made commercially available as a method of forming the metallic wiring.

The one-chip configuration of an analog device and a CMOS logic device and the application of Cu wiringhave generated various problems in the structure of an MIM capacitor provided in the analog device. Further, an electrode of the MIM capacitor formed by means of the damocene process also undergoes a problem resulting from the damocene process. Describing the problem, the flatness of a lower electrode in the MIM capacitor deteriorates due to dishing and erosion.

In the MIM capacitor of an analog device in which the Cu wiring formed by the damocene process constitute the electrode, the method wherein the electrode is formed in a comb shape was proposed in order to solve, particularly, the dishing problem generated in the electrode in the damocene process as recited in the conventional example 1 (No. 2001-237375 of the Japanese Patent Applications Laid-Open).

In the conventional damocene process, the density of the metallic wirings is increased in a larger area in order to reduce a parasitic resistance of the electrode generated when the lower electrode is formed, which, however, generates erosion. As a result, such a trouble as the variation of a capacitance value of the MIM capacitor occurs.

Below is described the erosion in the CMP (Chemical Mechanical Polishing). In the case where a structure, wherein Cu is provided in an upper layer and Cu and an interface between Cu and a conducive film is provided in a lower layer, is polished by means of the CMP, when Cu is continuously polished and the polishing process has reached a surface of the lower layer (Cu, interface between Cu and conductive film), the polish of the conductive film is substantially halted though the polish of Cu still advances (because a polishing rate of Cu is higher than that of the conductive film). The different polishing rates may cause such a state generated in the polishing process; however, a coverage shape of the plated Cu film has been suggested as a main cause thereof, for which FIG. 12 illustrating the conventional example 1 described earlier can be referred to.

As the polish of Cu selectively advances, Cu constituting the Cu wiring consequently grows concave, which generates a defference in level between the Cu wiring and the conductive film. Once the defference in level is generated, the conductive film adjacent to the concave Cu wiring is locally subjected to a high pressure. As a result, the polish of that part of the conductive film is restarted by a mechanical action thereby generated, and an insulation film therebelow may also be polished. On the other hand, the polish of the Cu wiring is not interrupted but continued by a chemical action. When these different polishing processes are repeatedly performed, the Cu wirings which are densely provided consequently have a concave portion. This phenomenon is called erosion.

The higher the metallic wiring density is, the more the erosion advances, because a larger number of Cu wirings grow concave as the metallic wirings are more densely provided. As a result, a high pressure is applied to the conductive film which is less densely provided in the same region, and the concave portion thereby further advances.

The conventional example 2 (J. M. Steigerwald, et al. "Pattern Geometry Effects in the Chemical-Mechanical Polishing of Inlaid Copper Structures," J. Electrochem. Soc., 141: 10, 2842-2848, October, 1994) recites a relationship between an erosion amount [nm] and a pattern density [%], which is illustrated in FIG. 20. According to FIG. 20, in the case where the metallic wirings are provided in such a large area as, for example, 200 μm square, it is necessary to set the metallic wirings as follows in order to reduce a desired parasitic resistance to at most 100 mΩ.

| metallic wiring resistance width: | 2 μm |
|---|---|
| metallic wiring density: | at least 80% |

However, as illustrated in FIG. 20, the erosion amount reaches a value exceeding 280 nm in the case where the metallic wiring resistance width is 5 μm and the metallic wiring density is 80% reaches a little above 280 nm. Therefore, the wiring film thickness of 30 nm would be necessary in the case of an MIM capacitance film wherein a silicon nitride film is used as the conductive film and the desired capacitance value (for example, 2 fF/mm$^2$) can be obtained. However, when the wiring film thickness of 30 nm is secured in the state where the erosion exceeding 280 nm is generated, the generated difference in level will be at least nine times as deep in such a wiring structure. In a similar manner, the wiring film thickness of 50 nm would be necessary in the case of an MIM capacitance film wherein a tantalum oxide film is used as the conductive film and a desired capacitance value (for example, 2 fF/mm$^2$) can be obtained. However, when the wiring film thickness of 50 nm is secured in the state where the erosion exceeding 280 nm is generated, the generated difference in level will be at least five times as deep in such a wiring structure. To the variation of the capacitance value are added 10% variation of the capacitance film thickness and approximately 5% increase in an effective surface area which constitutes the capacitance.

As is learnt from the foregoing description, the erosion amount is significantly increased in the case the metallic wiring density is increased in a larger area, according to the conventional methods, which makes it quite difficult to realize a desired capacitance variation (for example, approximately 10%). Further, it is clear from FIG. 21 (illustrating a relationship between the dishing amount [nm] and the pattern density [%] in each metallic wiring width in the conventional example 2) that the purpose of setting the metallic wiring width to 2 μm is to significantly lessen the concave portion generated in the metallic wiring. The metallic wiring of 2 μm denotes such a metallic wiring width that can limit the film thickness to at most 30 nm in the silicon nitride film and to at most 50 nm in the tantalum oxide film in the case where the dishing amount is approximately 20 nm. When all of the large area of 200 μm square is directly used for the Cu wirings, the dishing amount results in 520 µm, in which case the difference in level is maximized. Therefore, the Cu wirings having such a large area as 200 µm square cannot be used as the electrode of the MIM capacitance.

SUMMARY OF THE INVENTION

Therefore, a main object of the present invention is to prevent the variation of a capacitance value by unfailingly realizing the flatness of a lower electrode.

In order to achieve the object, the present invention is characterized in that a conductive film embedded in a predetermined region of an upper surface of an insulation film and metallic wirings embedded so as to protrude into the insulation film after penetrating through the conductive film constitute a lower electrode of an MIM capacitor.

A semiconductor device according to the present invention comprises:

a semiconductor substrate; and an MIM capacitor, the MIM capacitor comprising:

a first insulation film provided on the semiconductor substrate;

a first conductive film made of a material of which a polishing rate is lower than that of the first insulation film and embedded in a predetermined region of the first insulation film;

a plurality of grooves which penetrate through the first conductive film and reach the first insulation film;

metallic wirings embedded in the respective grooves so as to be in contact with the first conductive film;

a dielectric film provided on the metallic wirings and the first conductive film; and a second conductive film provided on the dielectric film, wherein the metallic wirings and the first conductive film constitute a lower electrode of the MIM capacitor, the dielectric film constitutes a dielectric layer of the MIM capacitor, and the second conductive film constitutes an upper electrode of the MIM capacitor.

A surface of the first conductive film and a surface of the metallic wirings are preferably flush with a plane extended from a surface of the first insulation film.

The first conductive film is preferably made of a material of which an etching selection ratio is higher than that of the first insulation film.

Preferably, the first insulation film comprises a lower insulation film and an upper insulation film, the first conductive film is provided on the predetermined region of the lower insulation film, and the upper insulation film is provided on a region other than the predetermined region of the lower insulation film.

Preferably, a second insulation film is further provided on the first insulation film and the first conductive film, the second insulation film has an opening above the metallic wirings, and the dielectric film and the second conductive film are provided in the opening.

The dielectric film is preferably made of silicon nitride or tantalum oxide.

The first conductive film is preferably made of metal nitride including TaN or TiN.

The metallic wirings preferably include copper or copper alloy as a main constituent thereof.

The second insulation film is preferably made of silicon nitride or silicon nitride-oxide.

According to the semiconductor device of the present invention, wherein the first conductive film having the polishing rate lower than that of the first insulation film is formed in a high-density metallic wiring region where the plurality of metallic wirings are densely provided, the depth of a concave portion generated in the first conductive film by erosion when the metallic film is polished to be removed by the CMP can be reduced. As a result, the semiconductor device having an electrode structure having the flat upper surface which does not depend on the density of the metallic wirings as the lower electrode of the MIM capacitor can be obtained.

Further, the first conductive film having the etching selection ratio higher than that of the first insulation film is formed in the high-density metallic wiring region where the plurality of metallic wirings are densely provided. Therefore, a difference in level generated between the metallic wirings and the first conductive film can be reduced, and the surface of the first insulation film and the surface of the first conductive film can be thereby made flush with each other. As a result, the electrode structure having the flat upper surface which does not depend on the density of the metallic wirings as the lower electrode of the MIM capacitor can be obtained, and the variation of a capacitance value resulting from the deterioration of the flatness of the lower electrode can be lessened.

A method of manufacturing a semiconductor device according to the present invention is a method of manufacturing a semiconductor device comprising an MIM capacitor, including:

a step of forming a first insulation film on a semiconductor substrate;

a step of embedding a first conductive film in a predetermined region of the first insulation film;

a step of forming a plurality of grooves which penetrate through the first conductive film and reach the first insulation film;

a step of embedding metallic wirings in the respective grooves by means of CMP so as to be in contact with the first conductive film;

a step of forming a dielectric film on the metallic wirings and the first conductive film; and a step of forming a second conductive film on the dielectric film, wherein the first conductive film of which a polishing rate in the CMP is lower than that of the first insulation film is embedded in the predetermined region in the step of embedding the first conductive film, the metallic wirings and the first conductive film constitute a lower electrode of the MIM capacitor, the dielectric film constitutes a dielectric layer of the MIM capacitor, and the second conductive film constitutes an upper electrode of the MIM capacitor.

The step of embedding the first conductive film preferably includes:

a step of forming a concave portion in the predetermined region of the first insulation film;

a step of forming the first conductive film on the first insulation film including the concave portion; and a step of polishing and thereby removing the first conductive film except for the concave portion by the CMP.

Preferably, a lower insulation film is formed on the semiconductor substrate in the step of forming the first insulation film, and the step of embedding the first conductive film includes:

a step of forming the first conductive film on the predetermined region of the lower insulation film;

a step of forming an upper insulation film on the lower insulation film including the first conductive film; and a step of polishing and thereby removing the upper insulation film by the CMP up to a position where the first conducive film is exposed, wherein the lower insulation film and the upper insulation film constitute the first insulation film.

Preferably, a step of forming a second insulation film on the first insulation film and the first conductive film and a step of forming an opening in the second insulation film above the metallic wirings are further included between the step of embedding the metallic wirings and the step of forming the dielectric film, the dielectric film is selectively formed in the opening in the step of forming the dielectric film, and the second conductive film is selectively formed in the opening in the step of forming the second conductive film.

The first conductive film having an etching selection ratio higher than that of the first insulation film is preferably embedded in the step of embedding the first conductive film.

The step of embedding the metallic wirings preferably includes:

a step of forming the metallic wirings on the first conductive film and the first insulation film including the grooves; and a step of polishing and thereby removing the metallic wirings by the CMP except for the concave portion.

The entire surface of the first insulation film and the first conductive film which is exposed as a result of the polishing is preferably polished by a predetermined amount in the step of polishing the metallic wirings.

According to the semiconductor device manufacturing method of the present invention, wherein the first conductive film having the polishing rate slower than that of the first insulation film is formed in the high-density metallic wiring region where the plurality of metallic wirings are densely provided, the depth of the concave portion generated in the first conductive film by the erosion can be reduced when the metallic film is polished to be removed by the CMP. As a result, the electrode structure having the flat upper surface irrespective of the density of the metallic wirings as the lower electrode of the MIM capacitor can be obtained.

Further, the first conductive film having the etching selection ratio higher than that of the first insulation film is formed in the high-density metallic wiring region where the plurality of metallic wirings are densely provided. Accordingly, the difference in level generated between the metallic wirings and the first conducive film is lessened, and the surface of the first insulation film and the surface of the first conductive film can be thereby made flush with each other. As a result, the electrode structure having the flat upper surface irrespective of the density of the metallic wirings as the lower electrode of the MIM capacitor can be obtained.

Further, the concave portion, which is possibly generated in the first conductive film by the erosion when all of the exposed surfaces of the first insulation film and the first conductive film are polished by the predetermined amount in the CMP, can be avoided because the polishing rate of the first conductive film is lower than that of the first insulation film. As a result, the surfaces of the first insulation film and the first conductive film can be made flush with each other, and the variation of the capacitance value resulting from the deterioration of the flatness of the lower electrode can be thereby reduced.

When the second insulation film is formed on the metallic wirings and the first conducive film constituting the lower electrode and the opening is formed in the second insulation film above the metallic wirings and the first conductive film by means of etching in the semiconductor device manufacturing method, the etching selection ratio between the second insulation film and the metallic wirings and the etching selection ratio between the second insulation film and the first conductive film are preferably at least 100.

According to the semiconductor device and the method of manufacturing the semiconductor device, the metallic wirings constituting the lower electrode of the MIM capacitor are separately formed in order to control the erosion and the dishing in the CMP, and the conductive film is provided between separate metallic wirings. Therefore, an enough space can be secured as a region functioning as the lower electrode of the MIM capacitor. As a result, the flatness can be surely obtained irrespective of the size of the lower electrode while the capacitance value remains the same, and a high-qualify MIM capacitor can be thereby realized.

The semiconductor device and the semiconductor device manufacturing method according to the present invention, wherein the MIM capacitance can be provided in the Cu wirings without any increase of the MIM capacitance variation, is quite useful when an analog device and a CMOS logic device which is increasingly miniaturized are mounted on one chip.

BRIEF DESCRIPTION OF THE DRAWINGS

These and other objects as well as advantages of the invention will become clear by the following description of preferred embodiments of the invention and be specified in the claims attached hereto. A number of benefits not recited in this specification will come to the attention of the skilled in the art upon the implementation of the present invention.

FIG. 21 is a graph illustrating a relationship between a dishing amount and the metallic wiring density according to the conventional example 2.

DETAILED DESCRIPTION OF THE INVENTION

Figure 1:
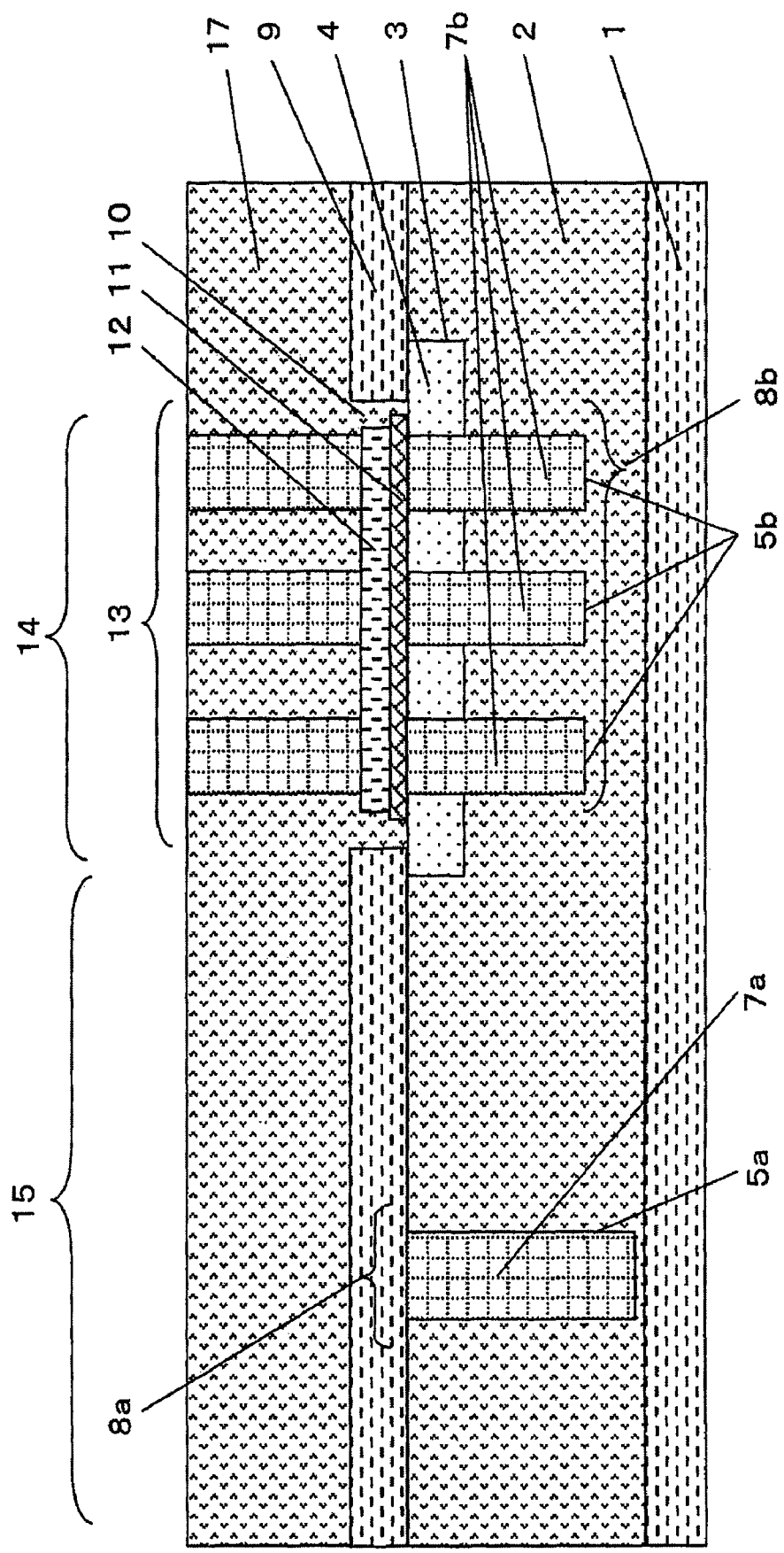
FIG. 1 is a sectional view illustrating a semiconductor device according to a preferred embodiment 1 of the present invention.
Figure 2:
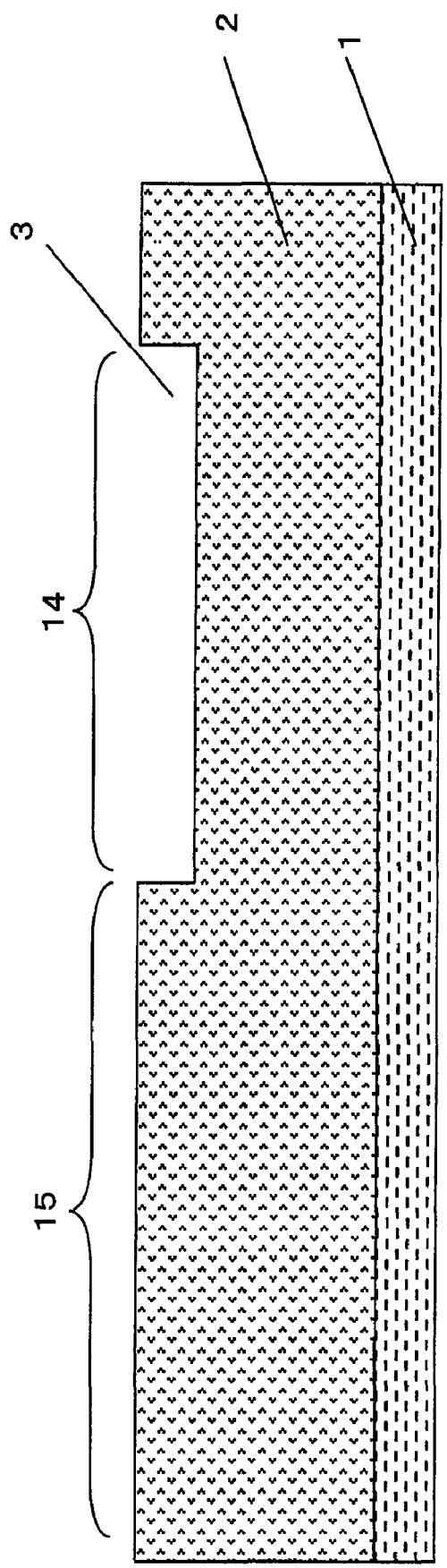
FIG. 2 is a sectional view illustrating a manufacturing process of the semiconductor device according to the preferred embodiment 1.

Hereinafter, preferred embodiments of the present invention are described referring to the drawings.

Preferred Embodiment 1

A semiconductor device according to a preferred embodiment 1 of the present invention and a method of manufacturing the semiconductor device are described referring to FIGS. 1-10. FIG. 1 is a sectional view illustrating the semiconductor device according to the preferred embodiment 1 comprising an MIM capacitor wherein a plurality of metallic wirings formed by means of the CMP constitute a lower electrode.

The semiconductor device according to the preferred embodiment 1 comprises a semiconductor substrate 1, a first insulation film 2, a concave portion 3, a first conductive film 4, a first groove 5a, second grooves 5b, a first metallic wiring 8a, second metallic wirings 8b, a second insulation film 9, an opening 10, a dielectric film 11, a second conductive film 12, and third metallic wirings 13.

A silicon oxide film constitutes the first insulation film 2, which is formed on the semiconductor substrate 1. The concave portion 3 is formed when the first insulation film 2 is removed in a predetermined depth. The first conductive film 4 is formed so as to fill the concave portion 3. A surface of the first conductive film 4 is flatly flush with a surface of the first insulation film 2. The first groove 5a is formed when the first insulation film 2 is etched in a predetermined depth. There is provided a plurality of second grooves 5b, and these grooves are formed when the etching is performed through the first conductive film 4 and further into the first insulation film 2 in a predetermined depth at the concave portion 3. In all of the preferred embodiments including the present preferred embodiment, the second grooves 5b constitute a plurality of grooves recited in the Scope of Claims. A first metallic film 7a embedded in the first groove 5a constitutes the first metallic wiring 8a. Second metallic films 7b respectively embedded in the second grooves 5b constitute the second metallic wirings 8b. In all of the preferred embodiments including the present preferred embodiment, the second metallic wirings 8b constitute metallic wirings recited in the Scope of Claims. The surfaces of the first conductive film 4 and the second metallic wirings 8b are flush with a plane extended from the surface of the first insulation film 2. The first conductive film 4s and the secondmetallic wirings 8b constitute a lower electrode of the MIM capacitor. The second insulation film 9 is formed on the first metallic wiring 8a and the second metallic wirings 8b. The opening 10 is formed in a way a part of the second insulation film 9 is drilled through up to the first insulation film 2. The opening 10 is formed where the first conductive film 4 and the second metallic wirings 8b are provided. The dielectric film 11 is formed, in the opening 10, on the first conductive film 4 and the second metallic wirings 8b in contact with the conductive film 4 and the wirings 8b. The second conductive film 12 is formed on the dielectric film 11. The third metallic wirings 13 are formed on the dielectric film 11 where the opening 10 is provided. The second conductive film 12 constitutes an upper electrode of the MIM capacitor. In the drawing, a reference numeral 14 denotes a high-density metallic wiring region which is a region where a plurality of metallic wirings are densely provided, and a reference numeral 15 denotes a low-densitymetallic wiring region which is a region where the metallic wirings are provided not densely but scatteringly.

A metal nitride film including TaN constitutes the first conductive film 4, and a copper film including copper or copper alloy as its main constituent constitutes the first metallic film 7a and the second metallic films 7b. A silicon nitride film constitutes the second insulation film 9. A silicon nitride film or a tantalum oxide film constitutes the dielectric film 11. A TaN film constitutes the second conductive film 12.

A third conductive film 6a and a fourth conductive film 6b may be respectively embedded in the first groove 5a and the second grooves 5b in some cases immediately before the first metallic film 7a and the second metallic films 7b are respectively embedded in the first groove 5a and the second grooves 5b. A Ta/TaN multilayered film constitutes the third conductive film 6a and the fourth conductive film 6b.

A polishing rate in the CMP of the first conductive film (TaN film) 4 is lower than that of the first insulation film (silicon oxide film) 2. Thus, the surfaces of the first insulation film 2 and the first conductive film 4 (where the plurality of second metallic wirings 8b are formed) are flattened by means of the CMP.

When the opening 10 is formed in the second insulation film 9 above the second metallic wirings 8b and the first conductive film 4, an difference in level is generated between the second metallic wirings 8b and the first conductive film 4. However, an etching selection ratio of the first conductive film (TaN film) 4 is higher than that of the first insulation film (silicon oxide film) 2. Therefore, the difference in level is reduced.

FIGS. 2-10 are sectional views illustrating a manufacturing process of the semiconductor device according to the preferred embodiment 1. In the process illustrated in FIG. 2, the first insulation film 2, which is a silicon oxide film having the thickness of 1,000 nm, is formed on the semiconductor substrate 1. After that, the first insulation film 2 is etched in a predetermined depth by means of the photolithograpy and dry etching, and the concave portion 3 having the depth of approximately 200 nm is formed. The concaved portion 3 is formed in the high-density metallic wiring region 14. At the time of the formation, the dimensions of the concave portion 3 is set so that the plurality of second metallic wirings 8b which are densely formed can be contained therein. In the low-density metallic wiring region 15 other than the high-density metallic wiring region 14, the metallic wirings are not formed, or an MIM capacitor is not formed on the metallic wirings even if the metallic wirings are formed.

Figure 3:
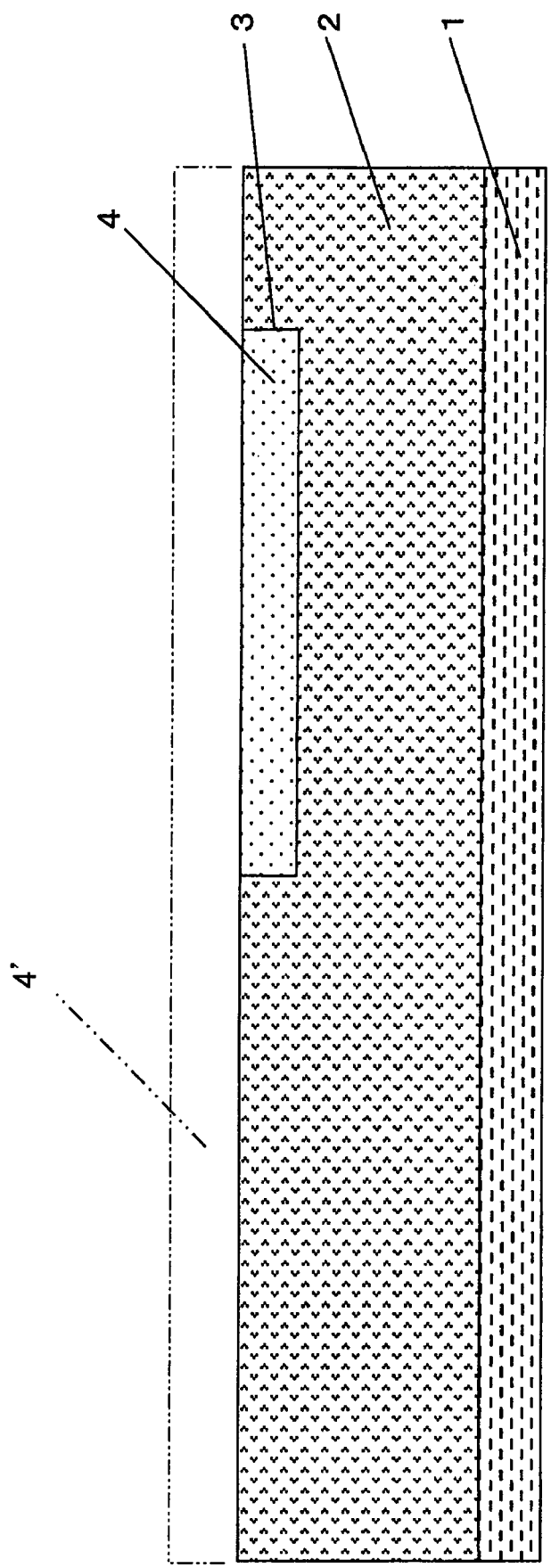
FIG. 3 is a sectional view illustrating the manufacturing process of the semiconductor device according to the preferred embodiment 1.

In the process illustrated in FIG. 3, a conductive layer 4' of which the polishing rate is lower and the etching selection ratio is higher than those of the first insulation film 2 in the CMP is formed in the thickness of approximately 400 nm on an entire surface of the first insulation film 2 including the concave portion 3. An example of the conductive layer 4' is TaN. After that, the conductive layer 4' is polished to be removed by the CMP so that the first conductive film 4 having the thickness of approximately 200 nm is embedded in the concave portion 3. At the time, the first conductive film 4 is formed so that the surfaces of the first insulation film 2 and the first conductive film 4 are continuously flat. In the polishing process, for example, oxidized slurry of colloidal silica is used as abrasive grains in the CMP. The following polishing conditions are set: polishing rotation speed=270 rpm; polishing load=3 psi; and slurry flow amount=100 cc/min, and a point where the polishing is terminated is detected. A polishing amount selection ratio under the above conditions in the case where TEOS is used as the first insulation film 2 is approximately TEOS:TaN=100:1.

Figure 4:
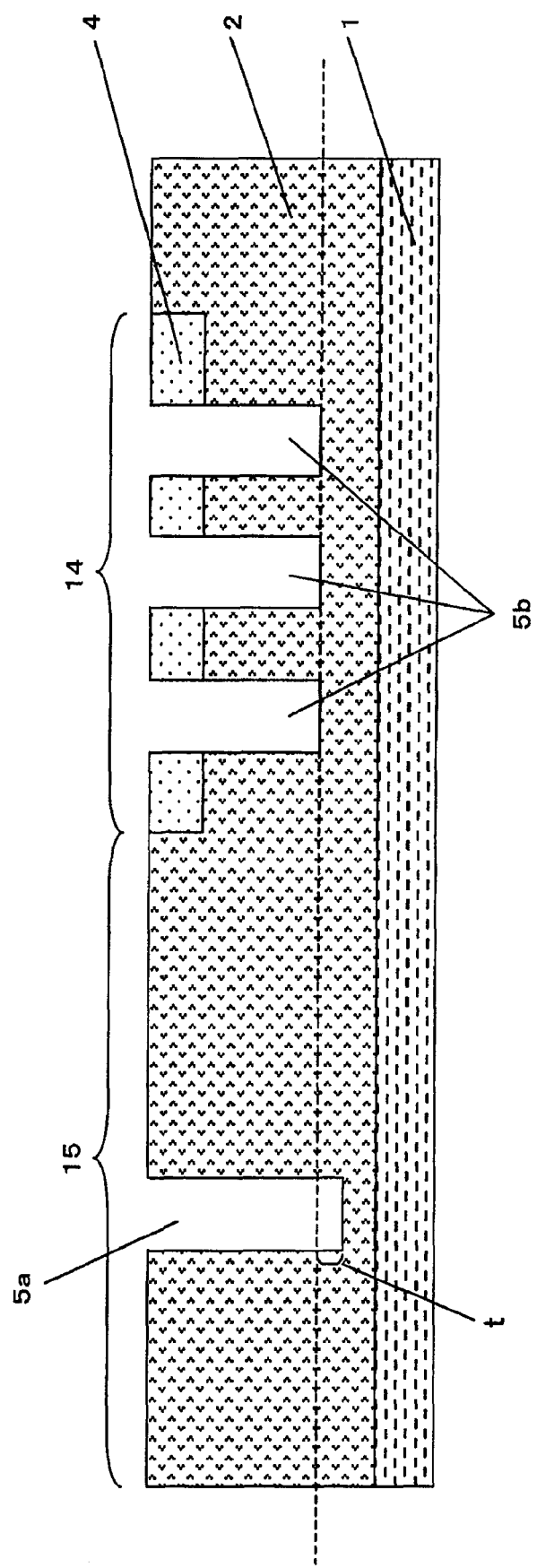
FIG. 4 is a sectional view illustrating the manufacturing process of the semiconductor device according to the preferred embodiment 1.

In the process illustrated in FIG. 4, the first groove 5a and the second grooves 5b are formed in the first insulation film 2 and the first conductive film 4 by means of etching. The first groove 5a and the second grooves 5b are respectively formed in the depths of, for example, approximately 800 nm (first groove 5a) and 600 nm (second grooves 5b). The first groove 5a is a groove where the metallic wirings are not densely but scatteringly formed in the low-density metallic wiring region 15, and is formed when the first insulation film 2 of the low-density metallic wiring region 15 is drilled in the depth of approximately 800 nm. The second grooves 5b are grooves where the metallic wirings are densely formed in the high-density metallic wiring region 14, and are formed when the first conductive film 4 of the high-density metallic wiring region 14 is drilled through and the first insulation film 2 therebelow is further drilled in the depth of approximately 400 nm. Thus, the first groove 5a is formed to be deeper than the second grooves 5b (t portion).

Figure 5:
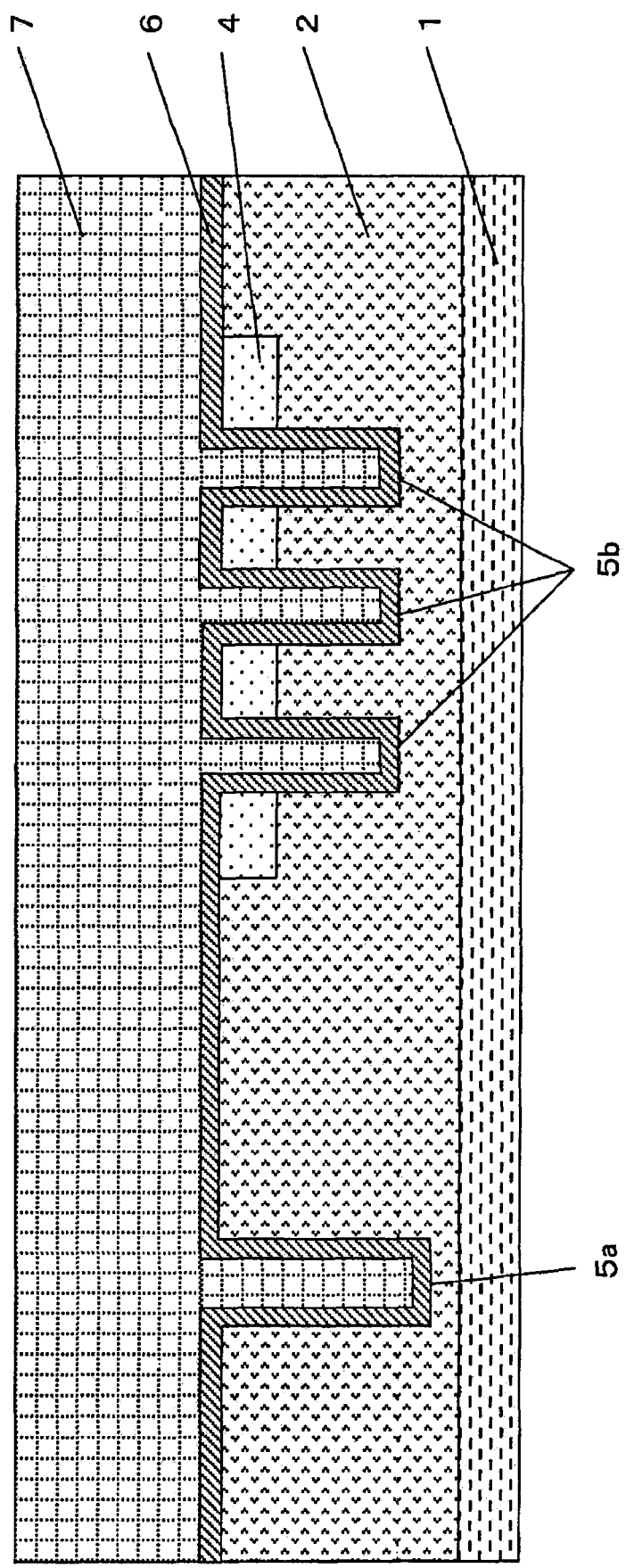
FIG. 5 is a sectional view illustrating the manufacturing process of the semiconductor device according to the preferred embodiment 1.

In the process illustrated in FIG. 5, the conductive film 6 having the thickness of 30 nm is formed on all of the surfaces of the first insulation film 2 and the first conductive film 4 including the first and second grooves 5a and 5b. An example of the conductive film 6 is a conductive film made of Ta and TaN. After the conductive film 6 is formed, a metallic film 7 including the copper or copper alloy as its main constituent is deposited in the thickness of approximately 900 nm on the conductive film 6.

Figure 6:
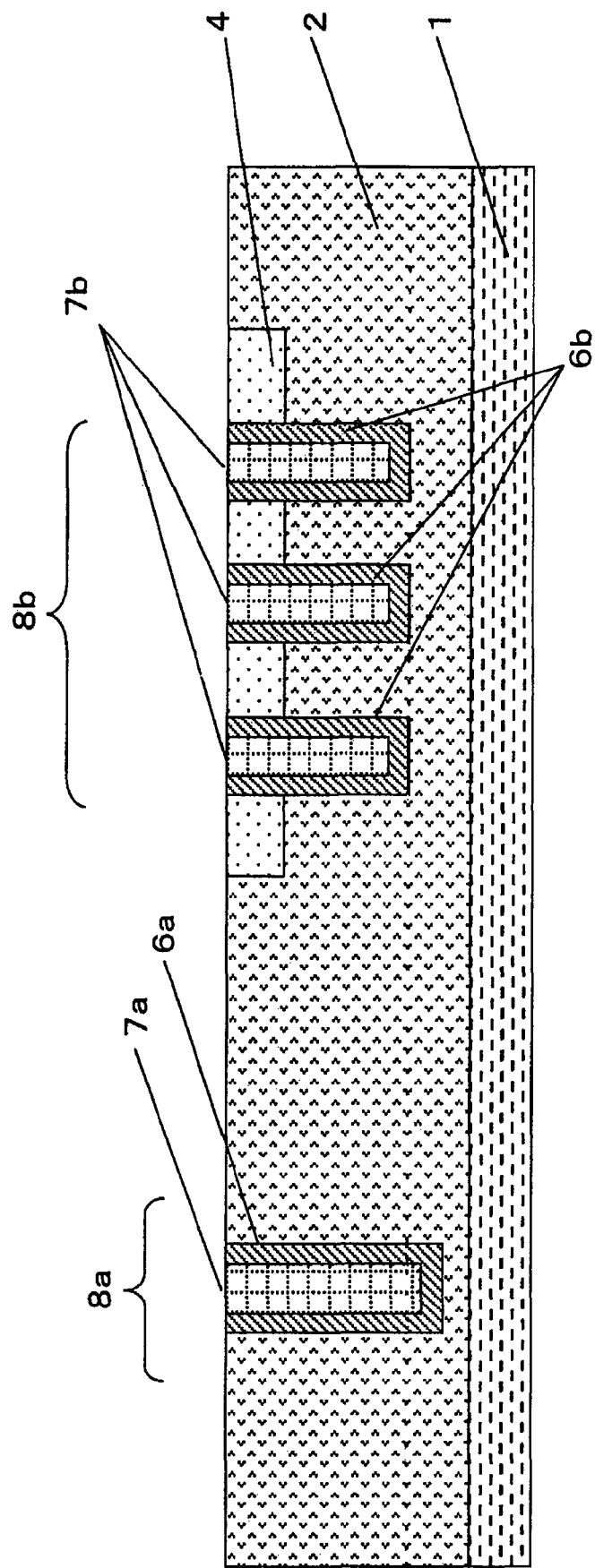
FIG. 6 is a sectional view illustrating the manufacturing process of the semiconductor device according to the preferred embodiment 1.

In the process illustrated in FIG. 6, the metallic film 7 and the conductive film 6 are polished to be removed by the CMP. Further, in the polishing process, the entire surface of the first insulation film 2 and the first conductive film 4 exposed through the CMP is polished by a predetermined thickness. The polishing amount at the time is approximately 50 nm in the thickness of the first conductive film 4, whereby the surface of the first insulation film 2 becomes flush with the surface of the first conductive film 4. In the polishing process, oxidized slurry of colloidal silica, for example, is used as the CMP abrasive grains, and the following polishing conditions are set: polishing rotation speed=270 rpm; polishing load=3 psi; and slurry flow amount=100 cc/min, and a point where the polishing is terminated is detected. The polishing amount selection ratio under the above conditions in the case where TEOS is used as the first insulation film 2 is approximately TEOS:TaN=100:1.

Accordingly, the first metallic wiring 8a (made of the third conductive film 6a and first metallic film 7a) is formed in the first groove 5a, while the second metallic wirings 8b (made of the fourth conductive film 6b and second metallic films 7b) are formed in the second grooves 5b. The first conductive film 4 and the second metallic wirings 8b constitute the lower electrode of the MIM capacitor.

Figure 7:
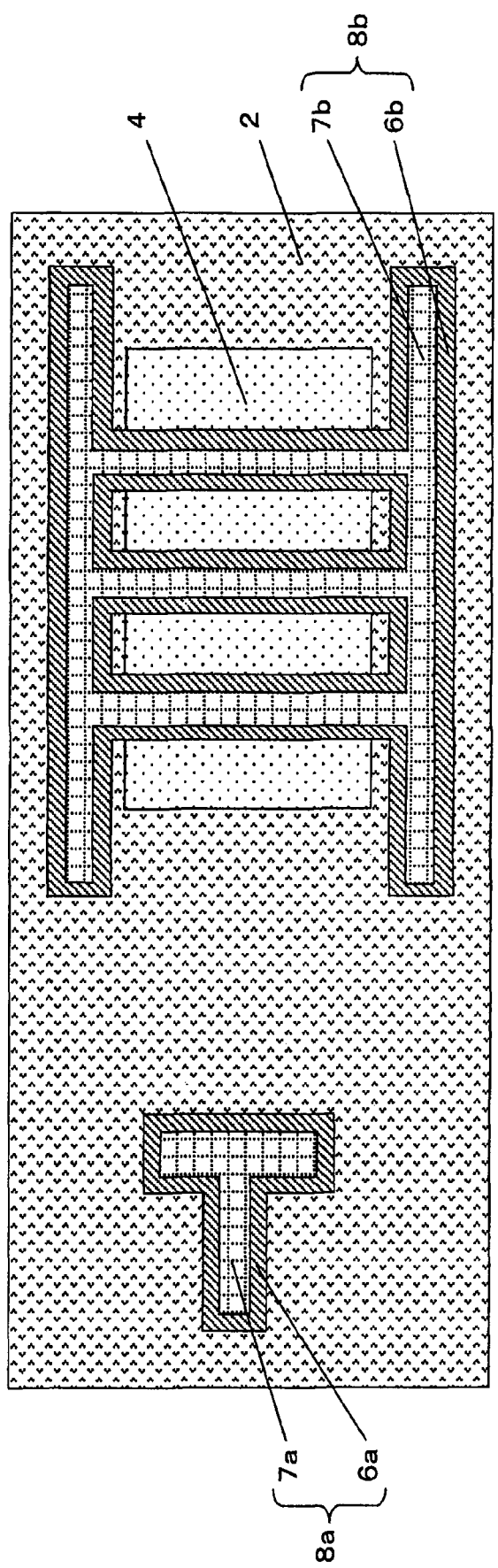
FIG. 7 is a plan view illustrating the manufacturing process of the semiconductor device according to the preferred embodiment 1.

As illustrated in FIG. 7 which is a plan view of the present process, the plurality of second metallic wirings 8b are formed in a ladder shape, and the metallic wirings 8b and the first conductive film 4 integrally constitute the lower electrode of the MIM capacitor. The ladder shape denotes such a shape that comprises wiring portions vertically facing each other in parallel and a plurality of cross-linking portions which couple the facing wiring portions. However, the second metallic wirings 8b are not necessarily formed in the ladder shape, and may be formed in a lattice shape, or in other shapes.

Figure 8:
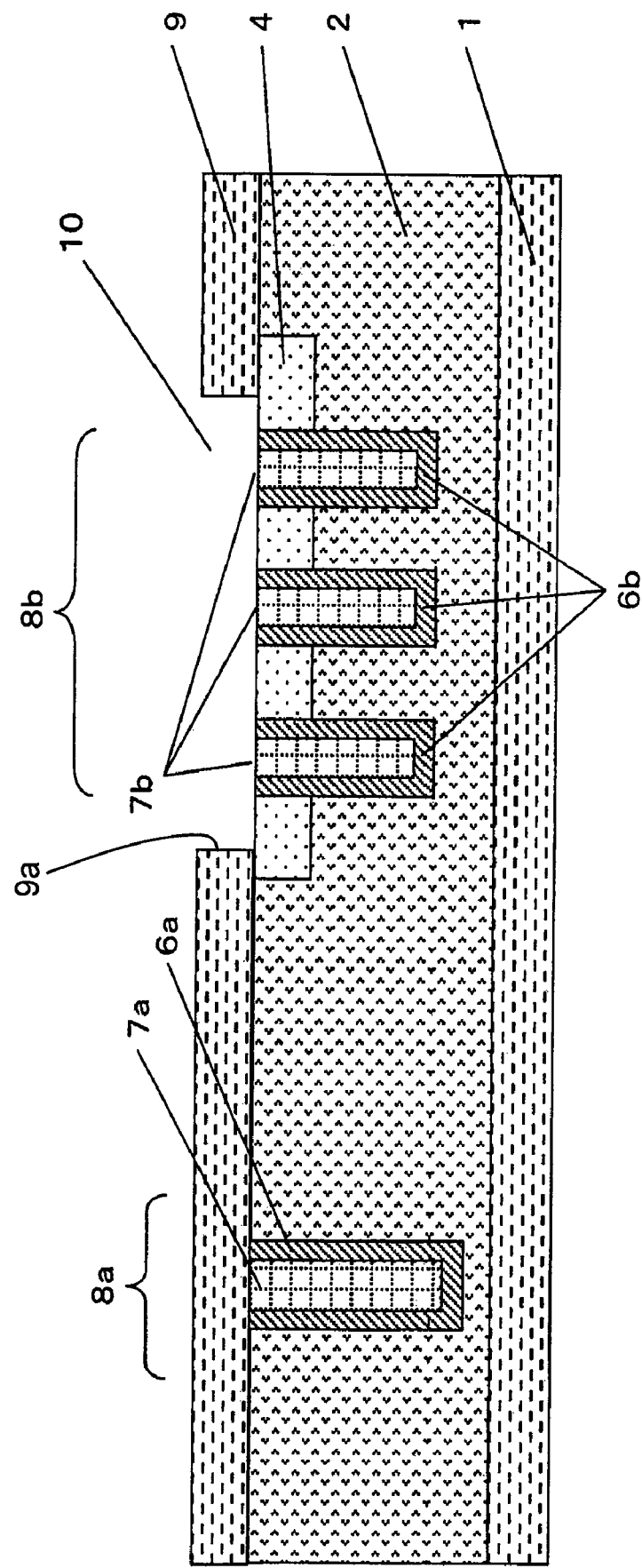
FIG. 8 is a sectional view illustrating the manufacturing process of the semiconductor device according to the preferred embodiment 1.

In the process illustrated in FIG. 8, the second insulation film 9, which is a silicon nitride film, is deposited in 200 nm, and the opening 10 is formed in the second insulation film 9 by means of photolithography and dry etching. The opening 10 is formed at a position where the second metallic wirings 8b are exposed. The dimensions of the opening 10 are set so that a peripheral edge of the first conductive film 4 embedded in the concave portion 3 is covered with an opening edge 9a.

Figure 9:
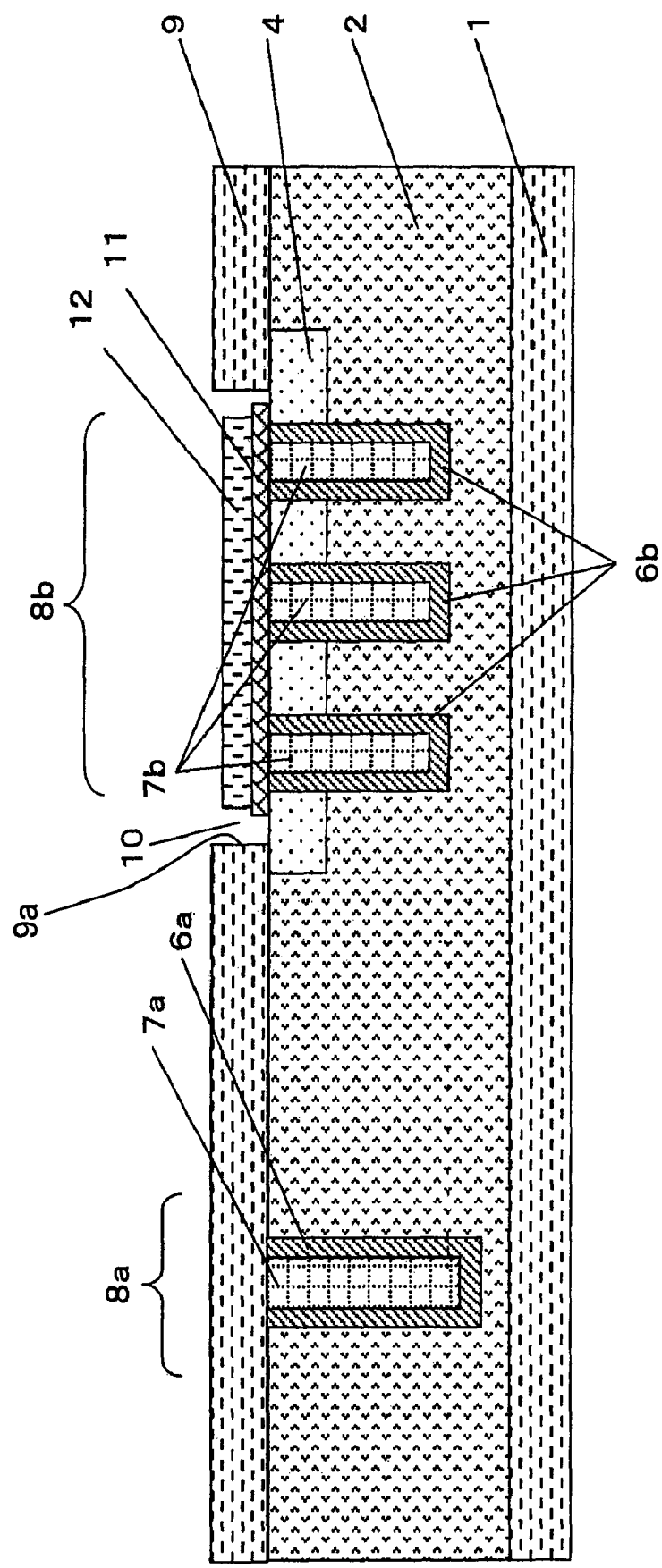
FIG. 9 is a sectional view illustrating the manufacturing process of the semiconductor device according to the preferred embodiment 1.

In the process illustrated in FIG. 9, the dielectric film 11, which is a silicon nitride film having the thickness of 30 nm, and the second conductive film 12, which is a TaN film having the thickness of 170 nm, are deposited one after another in this order on the second insulation film 9, and the dielectric film 11 and the second conductive film 12 are selectively removed, except for portions desired to be kept, by means of photolithography and dry etching. The portions of the dielectric film 11 and the second conductive film 12 which were selectively kept are at such a position that covers the second metallic wirings 8b in the opening 10. The second conductive film 12 constitutes an upper electrode of the MIM capacitor.

Figure 10:
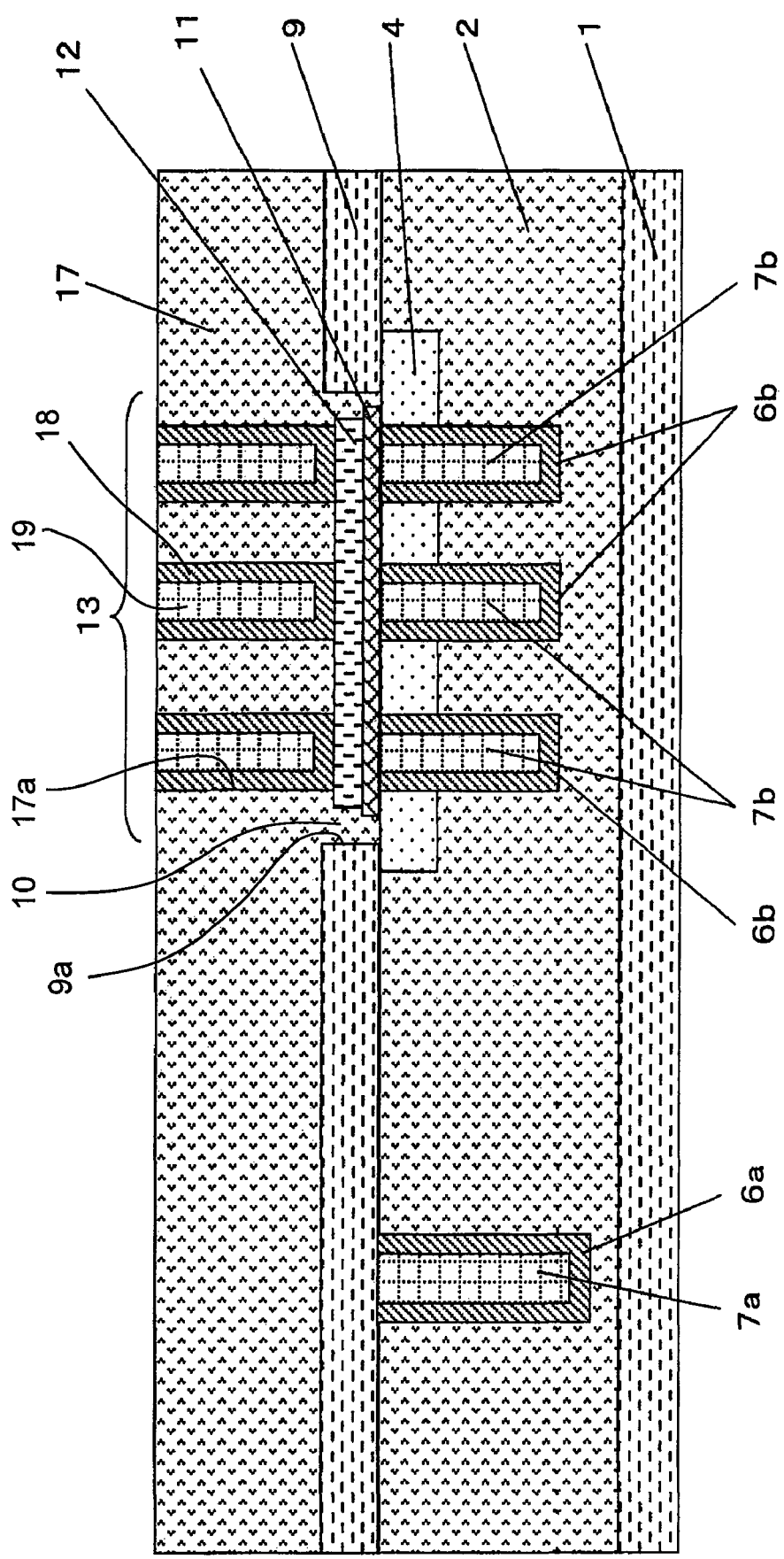
FIG. 10 is a sectional view illustrating the manufacturing process of the semiconductor device according to the preferred embodiment 1.

In the process illustrated in FIG. 10, the third metallic wirings 13 made of Cu are formed on the second conductive film 12 by means of the dual damocene process. Below is described in detail a method of forming the third metallic wirings 13.

A fourth insulation film 17 is deposited on the second insulation film 9 and the second conductive film 12, and the deposited fourth insulation film 17 is etched, so that grooves 17a are formed. The grooves 17a are located above the opening 10 and have such a depth that reaches the second conductive film 12. The grooves 17a are grooves in which the plurality of metallic wirings are densely formed. Next, a conductive film 18' having the thickness of 30 nm is formed on the entire surface of the fourth insulation film 17 including the grooves 17a. An example of the conductive film 18' is a conductive film made of Ta and TaN. After the conductive film 18' is formed, a metallic film 19' made of copper or copper alloy is deposited in the thickness of approximately 900 nm on the conductive film 18'. The conductive film 18' and the metallic film 19' are not shown in FIG. 10. Then, the metallic film 19' and the conductive film 18' present on the fourth insulation film 17, except for the metallic film 19' and the conductive film 18' in the groove 17a, are polished to be removed by the CMP. Hereinafter, the metallic film 19' and the conductive film 18' which remain after the polishing process are called a metallic film 19 and a conductive film 18, respectively. The metallic film 19 and the conductive film 18 are shown in FIG. 10.

Further, the entire surface of the fourth insulation film 17 which is exposed as a result of the polishing process is polished by a predetermine thickness. Accordingly, the fourth insulation film 17 is flattened, and the third metallic wirings (made of the conductive film 18 and metallic film 19) 13 are formed in the grooves 17a.

In the preferred embodiment 1, a silicon oxide film is used as the first insulation film 2, and TaN is used as the first conductive film 4. However, the first insulation film 2 and the first conductive film 4 are not necessarily limited to these materials, and any other materials may be selected as far as the polishing rate of the first conductive film 4 can be set to be lower than that of the first insulation film 2 and the etching selection ratio of the first conductive film 4 can be set to be higher than that of the first insulation film 2. In the case where an FSG film is selected as the first insulation film 2, for example, a TaN film of which the polishing rate is lower than that of the FSG film and the etching selection ratio is higher that that of the FSG film can be selected as the first conductive film 4. The first conductive film 4 may be made of a metal nitride film including TiN, and the second insulation film 9 may be made of a silicon nitride-oxide film.

According to the semiconductor device and the semiconductor device manufacturing method of the preferred embodiment 1, in the high-density metallic wiring region 14 where the plurality of second metallic wirings 8b are densely formed, the first conductive film 4 of which the polishing rate is lower than that of the first insulation film 2 is formed. Therefore, the depth of the concave portion generated in the first conductive film 4 by erosion is reduced when the metallic film 7 and the conductive film 6 are polished to be removed by the CMP. More specifically, as soon as the first conducive film 4 is exposed, the polishing process is substantially halted because the polishing rate of the first conductive film 4 is lower than that of the first insulation film 2. In the high-density metallic wiring region 14, wherein the metallic wirings are densely formed, any further advancement of the polish for the metallic film 7 formed in the first conductive film 4 can be substantially controlled. Accordingly, the generation of concave portion can be controlled in the second metallic films 7b and the first conductive film 4, and the advancement of the polish in the first insulation film 2 (particularly, edge portion) is controlled. As a result, the occurrence of the erosion can be controlled, and the surface of the first insulation film 2 is kept flush with the surface of the second metallic wirings 8b (process illustrated in FIG. 6).

Furthermore, in the high-density metallic wiring region 14 where the plurality of second metallic wirings 8b are densely formed, the first conductive film 4 of which the etching selection ratio is higher than that of the first insulation film 2 is formed. Therefore, a difference in level generated between the second metallic wirings 8b and the first conductive film 4 is lessened when the opening 10 is formed in the second insulation film 9, and the surface of the first insulation film 2 is kept flush with the surface of the first conducive film 4. As a result, the lower electrode of the MIM capacitor having a flat surface structure irrespective of the density of the metallic wirings can be obtained (process illustrated in FIG. 8).

Further, the polishing rate of the first conductive film 4 is lower than that of the first insulation film 2. Accordingly, the concave portion conventionally generated in the first conductive film 4 by erosion when the entire surface of the first insulation film 2 and the first conducive film 4 is polished by the predetermined amount by the CMP can be avoided, and the surface of the first insulation film 2 is kept flush with the surface of the first conductive film 4 (see the process illustrated in FIG. 6). As a result, the capacitance variation resulting from the deterioration of the flatness in the lower electrode can be reduced.

Preferred Embodiment 2

Figure 11:
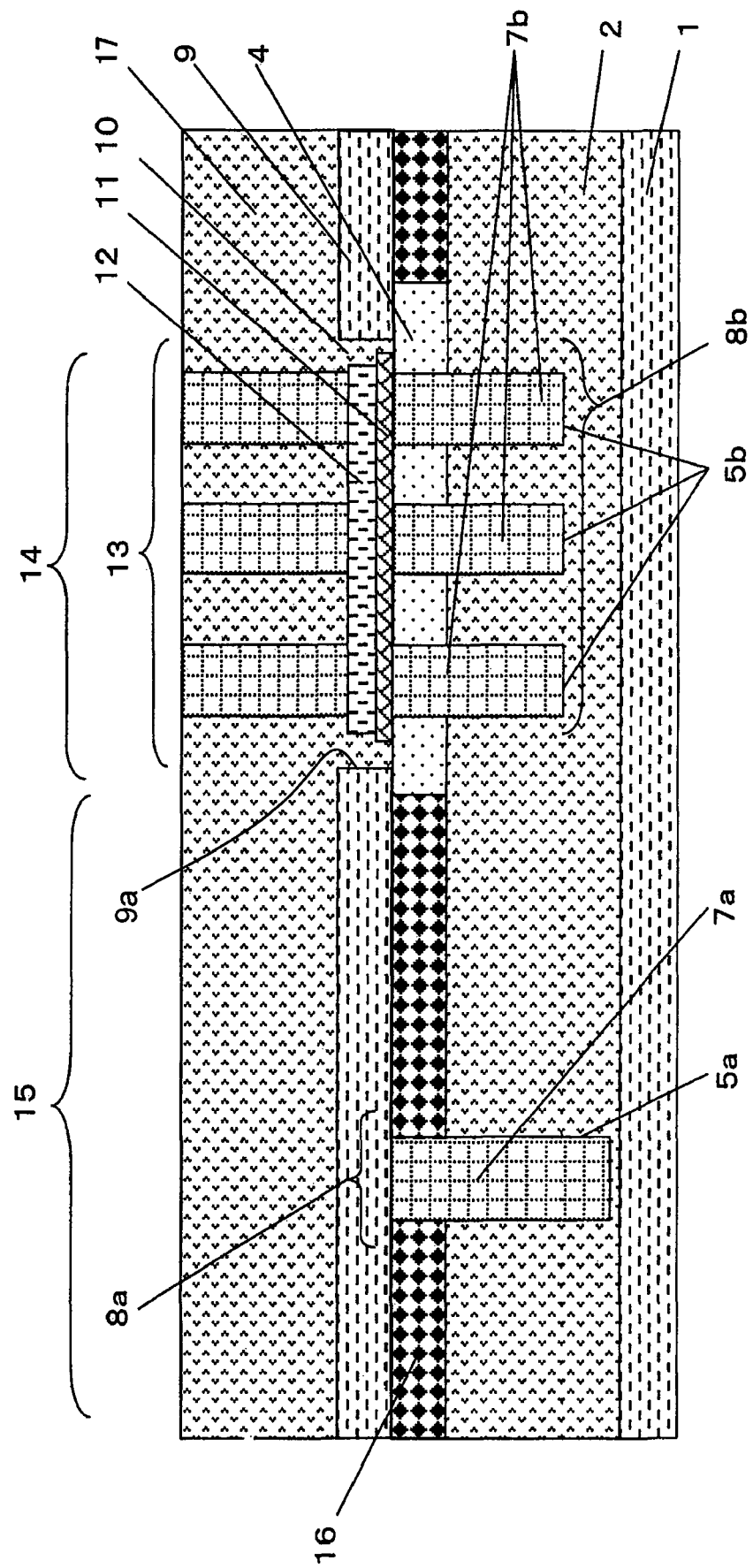
FIG. 11 is a sectional view illustrating a semiconductor device according to a preferred embodiment 2 of the present invention.
Figure 12:
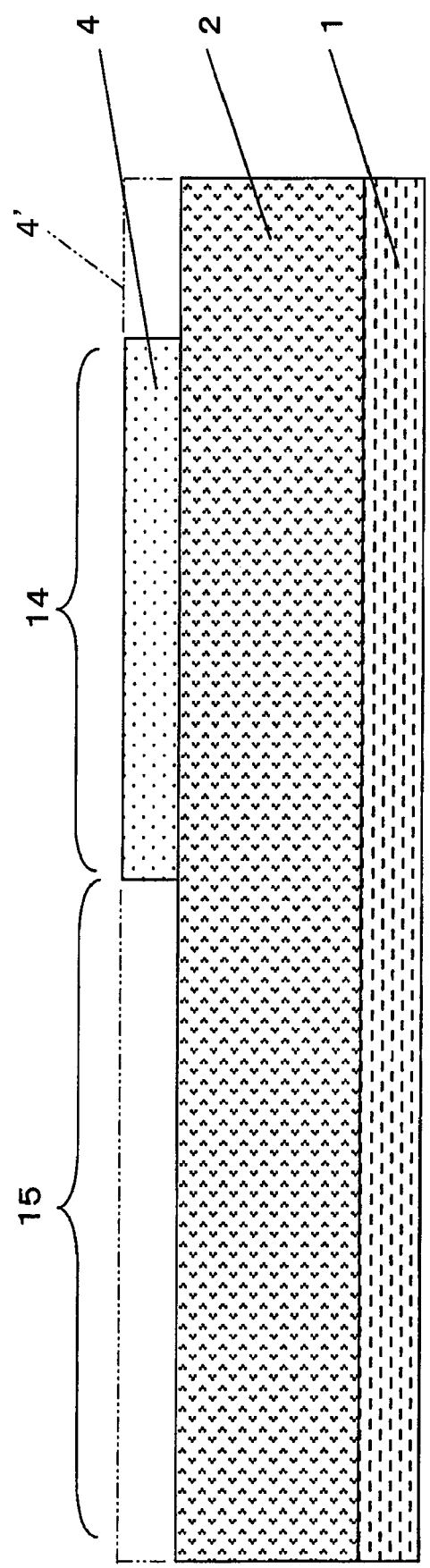
FIG. 12 is a sectional view illustrating a manufacturing process of the semiconductor device according to the preferred embodiment 2.

A semiconductor device according to a preferred embodiment 2 of the present invention and a method of manufacturing the semiconductor device are described referring to FIGS. 11-19. FIG. 11 is a sectional view illustrating the semiconductor device according to the preferred embodiment 2 comprising an MIM capacitor wherein a plurality of metallic wirings formed by means of the CMP constitute a lower electrode.

The semiconductor device according to the preferred embodiment 2 comprises a semiconductor substrate 1, a first insulation film 2, a first conductive film 4, a third insulation film 16, a first groove 5a, second grooves 5b, a first metallic wiring 8a, second metallic wirings 8b, a second insulation film 9, an opening 10, a dielectric film 11, a second conductive film 12, and third metallic wirings 13.

A silicon oxide film constitutes the first insulation film 2, which is formed on the semiconductor substrate 1. The first insulation film 2 constitutes a lower insulation film. The first conductive film 4 is formed on a predetermined region of the first insulation film 2. A silicon oxide film constitutes the third insulation film 16, which is formed in a region on the first insulation film 2 other than the predetermined region. The third insulation film 16 is provided so as to be in contact with the first conductive film 4. The third insulation film 16 constitutes an upper insulation film. The first groove 5a is formed when the third insulation film 16 is etched in a predetermined depth. The second grooves 5b are a plurality of grooves, which are formed at a position where the first conductive film 4 is provided when the etching is performed through the first conductive film 4 and further into the first insulation film 2 in a predetermined depth. A first metallic film 7a embedded in the first groove 5a constitutes the first metallic wiring 8a, and second metallic wirings 7b respectively embedded in the second grooves 5b constitute the secondmetallic wirings 8b. Surfaces of the first conductive film 4 and the second metallic wirings 8b are flush with a plane extended from a surface of the first insulation film 2. The first conductive film 4 and the second metallic wirings 8b constitute a lower electrode of the MIM capacitor. The second insulation film 9 is formed on the first metallic wring 8a and the second metallic wirings 8b. The opening 10 is formed when a part of the second insulation film 9 is drilled through up to the first insulation film 2. The opening 10 is formed where the first conductive film 4 and the second metallic wirings 8b are provided. The dielectric film 11 is formed on the first conductive film 4 and the second metallic wirings 8b so as to be in contact with the film 4 and the wirings 8b in the opening 10. The second conductive film 12 is formed on the dielectric film 11. The third metallic wirings 13 are formed on the dielectric film 11 where the opening 10 is provided. The third metallic wirings 13 constitute an upper electrode of the MIM capacitor. In the drawing, a reference numeral 14 denotes a high-density metallic wiring region which is a region where a plurality of metallic wirings are densely provided, and a reference numeral 15 denotes a low-density metallic wiring region which is a region where the metallic wirings are provided not densely but scatteringly.

A metal nitride film including TaN constitutes the first conductive film 4, a copper film including copper or copper alloy as its main constituent constitutes the first metallic film 7a and the second metallic films 7b, a silicon nitride film constitutes the second insulation film 9, a silicon nitride film or a tantalum oxide film constitutes the dielectric film 11, and a TaN film constitutes the second conductive film 12.

The third conductive film 6a and the fourth conductive film 6b may be respectively embedded in the first groove 5a and the second grooves 5b in some cases immediately before the first metallic film 7a and the second metallic films 7b are respectively embedded in the first groove 5a and the second grooves 5b. A Ta/TaN multilayered film constitutes the third conductive film 6a and the fourth conductive film 6b.

A polishing rate in the CMP of the first conductive film (TaN film) 4 is lower than that of the third insulation film (silicon oxide film) 16. Therefore, the surfaces of the third insulation film 16 and the first conductive film 4 (where the plurality of second metallic wirings 8b are formed) are made flush with each other by means of the CMP.

When the opening 10 is formed in the second insulation film 9 above the second metallic wirings 8b and the first conductive film 4, an difference in level is generated between the second metallic wirings 8b and the first conductive film 4. However, an etching selection ratio of the first conductive film (TaN film) 4 is higher than that of the third insulation film (silicon oxide film) 16. Therefore, the difference in level is reduced.

FIGS. 12-19 are sectional views illustrating a manufacturing process of the semiconductor device according to the preferred embodiment 2. In the process illustrated in FIG. 12, the first insulation film 2, which is made of a silicon oxide film having the thickness of 800 nm, is formed on the semiconductor substrate 1. After that, a first conductive film 4', which is made of a TaN film having the thickness of 200 nm, is formed on the first insulation film 2, and the first conductive film 4' is patterned by means of photolithograpy and dry etching. In the patterning process, the first conductive film 4' in the high-density metallic wiring region 14 is selectively kept, and the first conductive film 4' in the other region (including the low-density metallic wiring region 15) is removed. The patterned first conductive film is hereinafter called the first conductive film 4. The first conductive film 4 is formed so as to have such dimensions (area) that can cover the high-density metallic wiring region 14.

Figure 13:
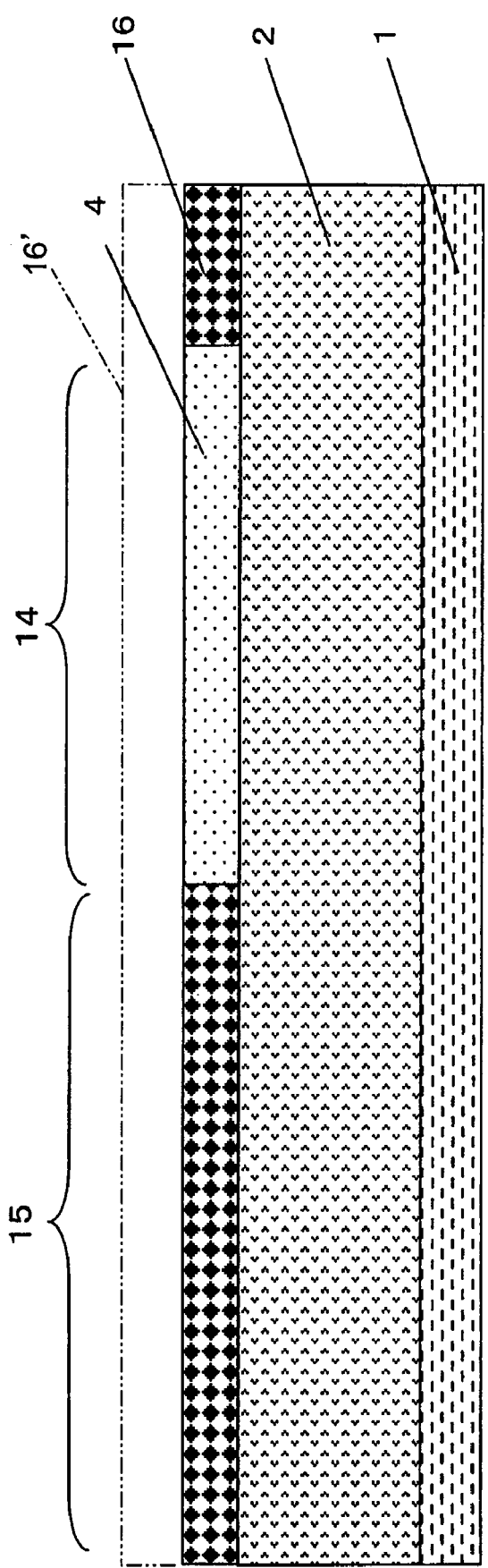
FIG. 13 is a sectional view illustrating the manufacturing process of the semiconductor device according to the preferred embodiment 2.

Next, in the process illustrated in FIG. 13, a third insulation film 16' is formed in the thickness of approximately 500 nm on the entire surface of the first insulation film 2 including the first conductive film 4. A silicon oxide film of which a polishing rate in the CMP is higher than that of the first conductive film 4, and an etching selection ratio is lower than that of the first conductive film 4 constitutes the third insulation film 16'. After that, the third insulation film 16' is polished to be removed by the CMP. The third insulation film 16' is polished to be removed until the surface of the first conductive film 4 is exposed. Accordingly, the third insulation film 16' having the thickness of approximately 200 nm is kept on the entire surface of the first insulation film 2 where the first conductive film 4 is not formed in a state where the third insulation film 16' is in contact with the first conductive film 4. The remaining third insulation film 16' is hereinafter called the third insulation film 16. Because the third insulation film 16' is polished and thereby removed, the surfaces of the first conductive film 4 and the third insulation film 16 are made flush with each other. In the polishing and removal process (CMP), oxidized slurry of colloidal silica is used as the CMP abrasive grains, and the following polishing conditions are set: polishing rotation speed=270 rpm; polishing load=3 psi; and slurry flow amount=100 cc/min. Then, a point where the polishing is terminated is detected. A polishing amount selection ratio under the above conditions in the case where TEOS is used as the first insulation film 2 is approximately TEOS:TaN=100:1.

The low-density metallic wiring region 15 (where the first conductive film 4 is not formed) is a region where the metallic wirings are not formed, or the MIM capacitance is not formed even if the metallic wirings are formed.

Figure 14:
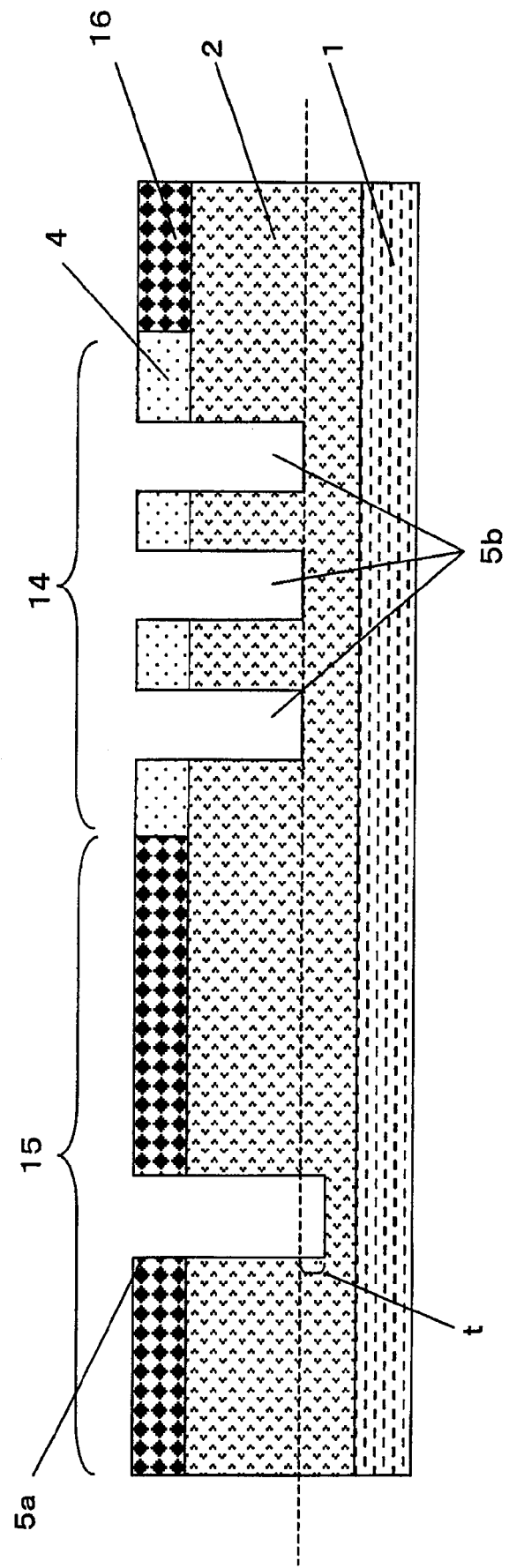
FIG. 14 is a sectional view illustrating the manufacturing process of the semiconductor device according to the preferred embodiment 2.

In the process illustrated in FIG. 14, the first groove 5a and the second groove 5b are formed in the first insulation film 2, first conductive film 4 and third insulation film 16 by means of etching. The first groove 5a and the second groove 5b are respectively formed in the depth of approximately 800 nm (first groove 5a) and the depth of 600 nm (second groove 5b). The first groove 5a is a groove where the metallic wirings are scatteringly (not densely) formed in the low-density metallic wiring region 15. The first groove 5a is formed in such a way that the third insulation film 16 (thickness of 200 nm) of the low-density metallic wiring region 15 is drilled through and the first insulation film 2 therebelow is further drilled in the depth of approximately 600 nm. The second grooves 5b are grooves where the metallic wirings are densely formed in the high-density metallic wiring region 14. The second grooves 5b are formed in such a way that the first conductive film 4 (thickness of 200 nm) of the high-density metallic wiring region 14 is drilled through and the first insulation film 2 therebelow is further drilled in the depth of approximately 400 nm. Thus, the first groove 5a is formed to be deeper than the second grooves 5b (t portion).

Figure 15:
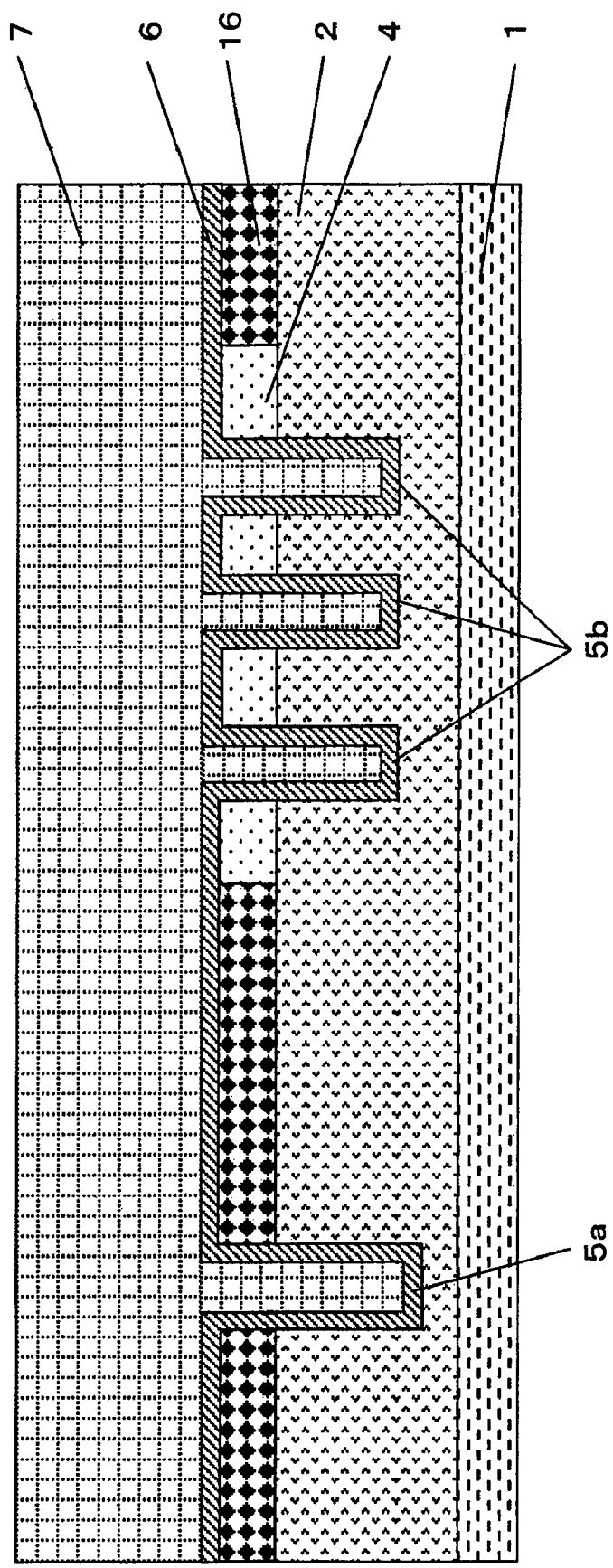
FIG. 15 is a sectional view illustrating the manufacturing process of the semiconductor device according to the preferred embodiment 2.

In the process illustrated in FIG. 15, the conductive film 6 having the thickness of 30 nm is formed on the entire surface of the first conductive film 4 and the third insulation film 16 including the grooves 5. An example of the conductive film 6 is a conductive film made of Ta and TaN. After the formation of the conducive film 6, a metallic film 7 including copper or copper alloy is deposited in the thickness of approximately 900 nm on the conductive film 6.

Figure 16:
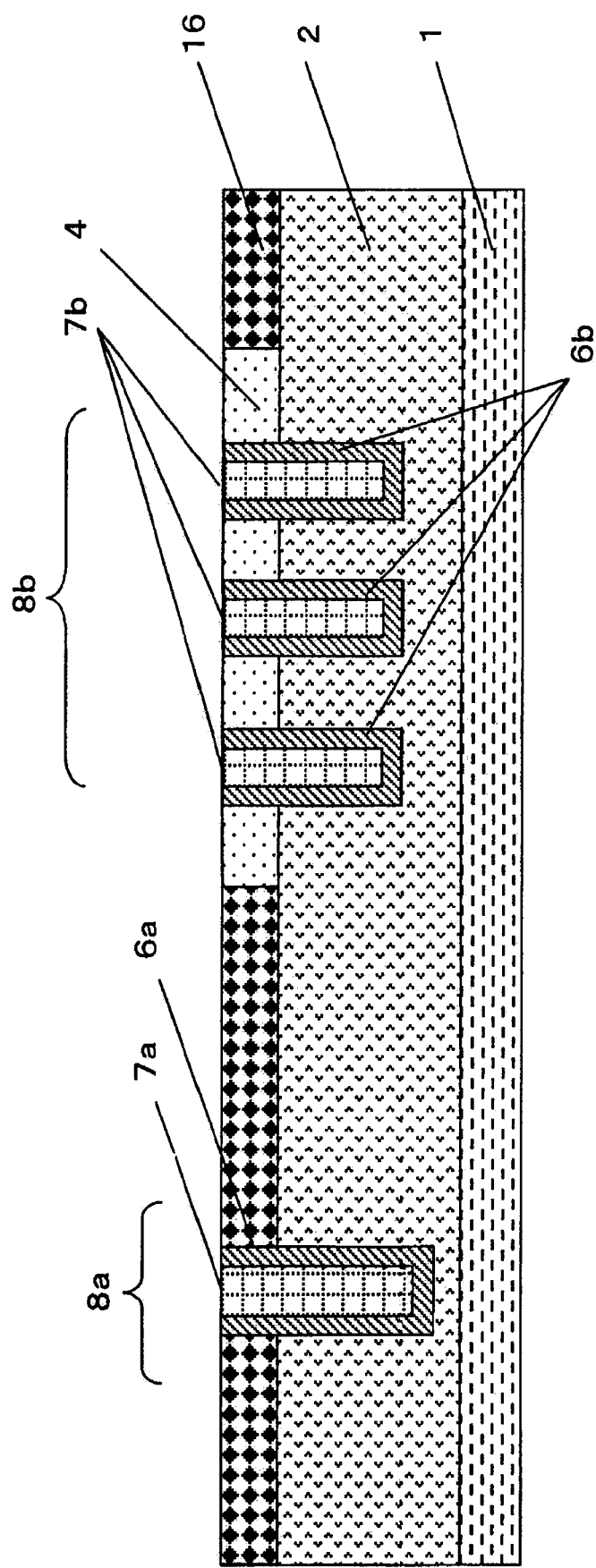
FIG. 16 is a sectional view illustrating the manufacturing process of the semiconductor device according to the preferred embodiment 2.

In the process illustrated in FIG. 16, the metallic film 7 and the conductive film 6 are polished to be removed by the CMP. The entire surface of the first conductive film 4 and the third insulation film 16 exposed as a result of the polishing process is polished by a predetermined thickness. At the time, a polishing amount is, for example, approximately 50 nm in terms of the thickness of the first conductive film 4. As a result, the surface of the first conductive film 4 becomes flush with the surface of the third insulation film 16. In the polishing and removal process, oxidized slurry of colloidal silica is used as the CMP abrasive grains, and the following polishing conditions are set: polishing rotation speed=270 rpm; polishing load=3 psi; and slurry flow amount=100 cc/min. Then, a point where the polishing is terminated is detected. A polishing amount selection ratio under the above conditions in the case where TEOS is used as the first insulation film 2 is approximately TEOS:TaN=100:1.

Accordingly, the first metallic wiring 8a (made of the third conductive film 6a and first metallic film 7a) is formed in the first groove 5a, and the second metallic wirings 8b (made of the fourth conductive film 6b and second metallic films 7b) are formed in the second grooves 5b. The first conductive film 4 and the secondmetallic wirings 8b constitute a lower electrode of the MIM capacitor.

Figure 17:
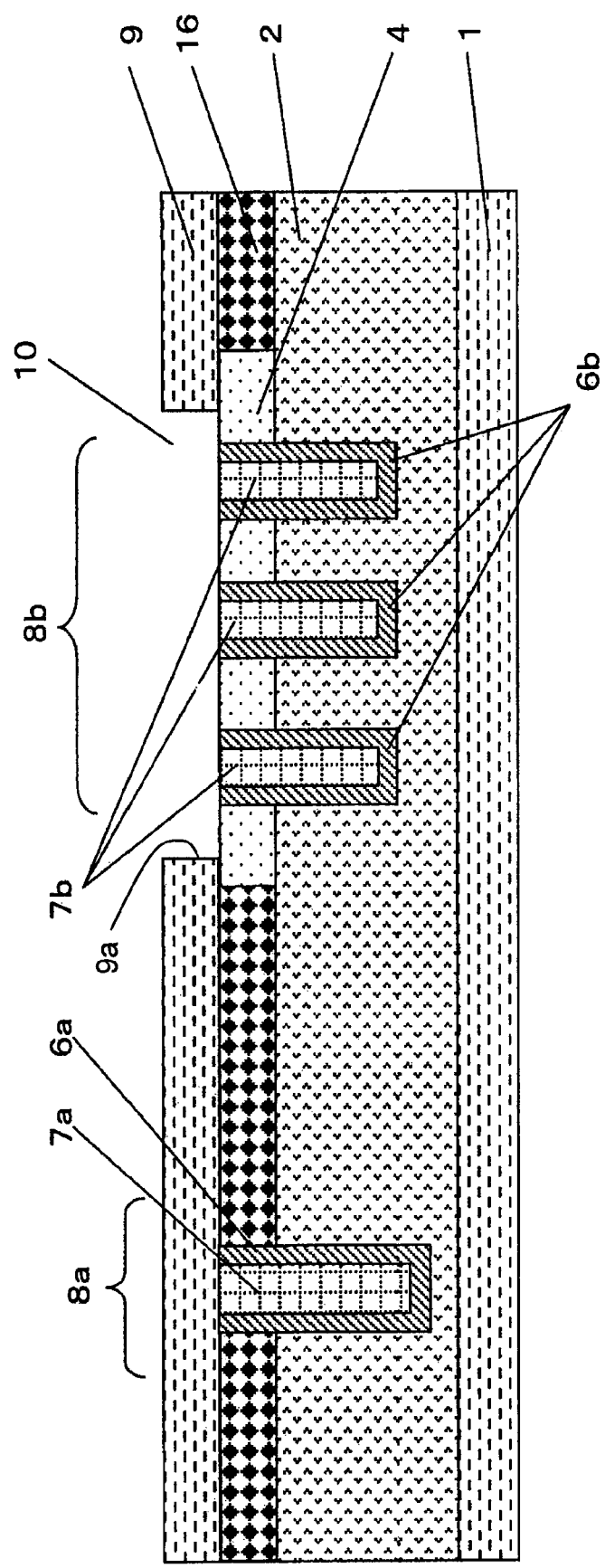
FIG. 17 is a sectional view illustrating the manufacturing process of the semiconductor device according to the preferred embodiment 2.

In the process illustrated in FIG. 17, the second insulation film 9, which is made of the silicon nitride film, is deposited in the thickness of 200 nm, and the opening 10 is formed in the second insulation film 9 by means of photolithography and dry etching. The opening 10 is formed at a position where the second metallic wirings 8b are exposed. The dimensions of the opening 10 is set so that a peripheral edge of the first conductive film 4 is covered with an opening edge 9a.

Figure 18:
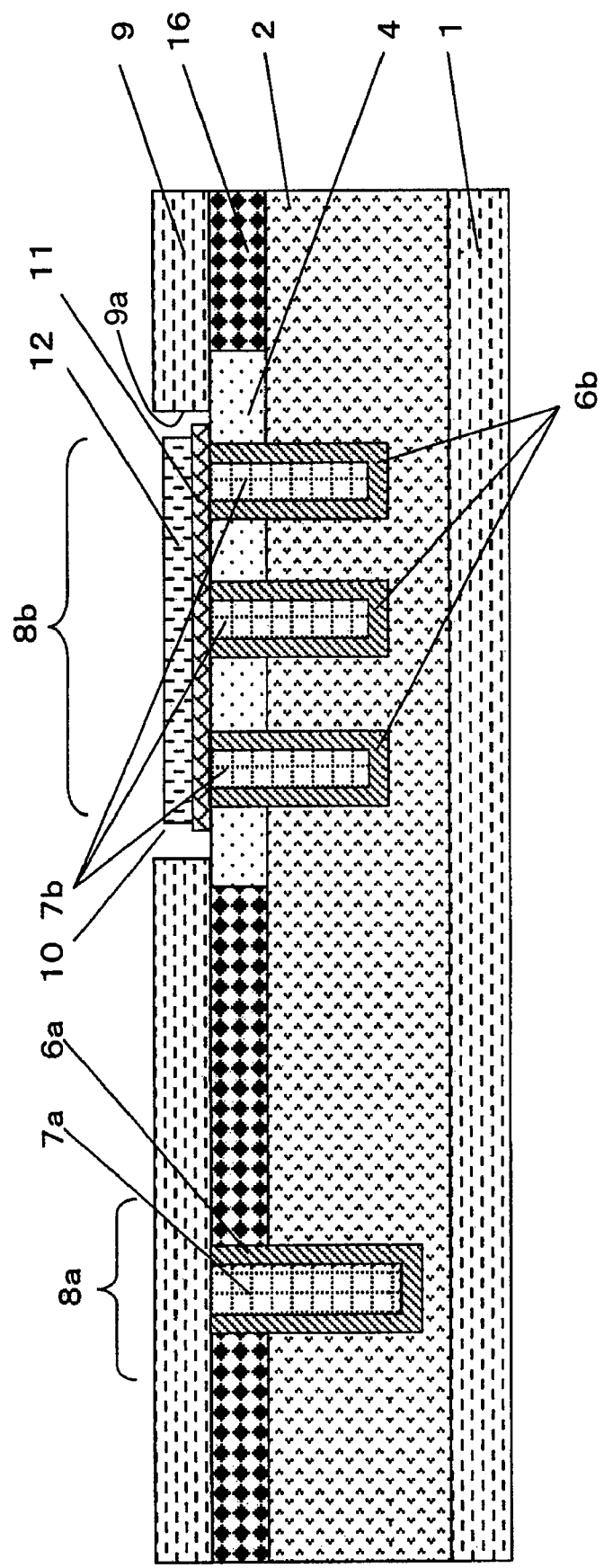
FIG. 18 is a sectional view illustrating the manufacturing process of the semiconductor device according to the preferred embodiment 2.

In the process illustrated in FIG. 18, the dielectric film 11, which is made of a silicon nitride film having the thickness of 30 nm, and the second conductive film 12, which is made of a TaN film having the thickness of 170 nm, are deposited one after another in this order on the second insulation film 9, and the dielectric film 11 and the second conductive film 12 are selectively removed by means of photolithography and dry etching except for portions desired to be kept. The portions desired to be kept of the dielectric film 11 and the second conductive film 12 are at a position where the second metallic wirings 8b are covered in the opening 10. The second conductive film 12 constitutes an upper electrode of the MIM capacitor.

Figure 19:
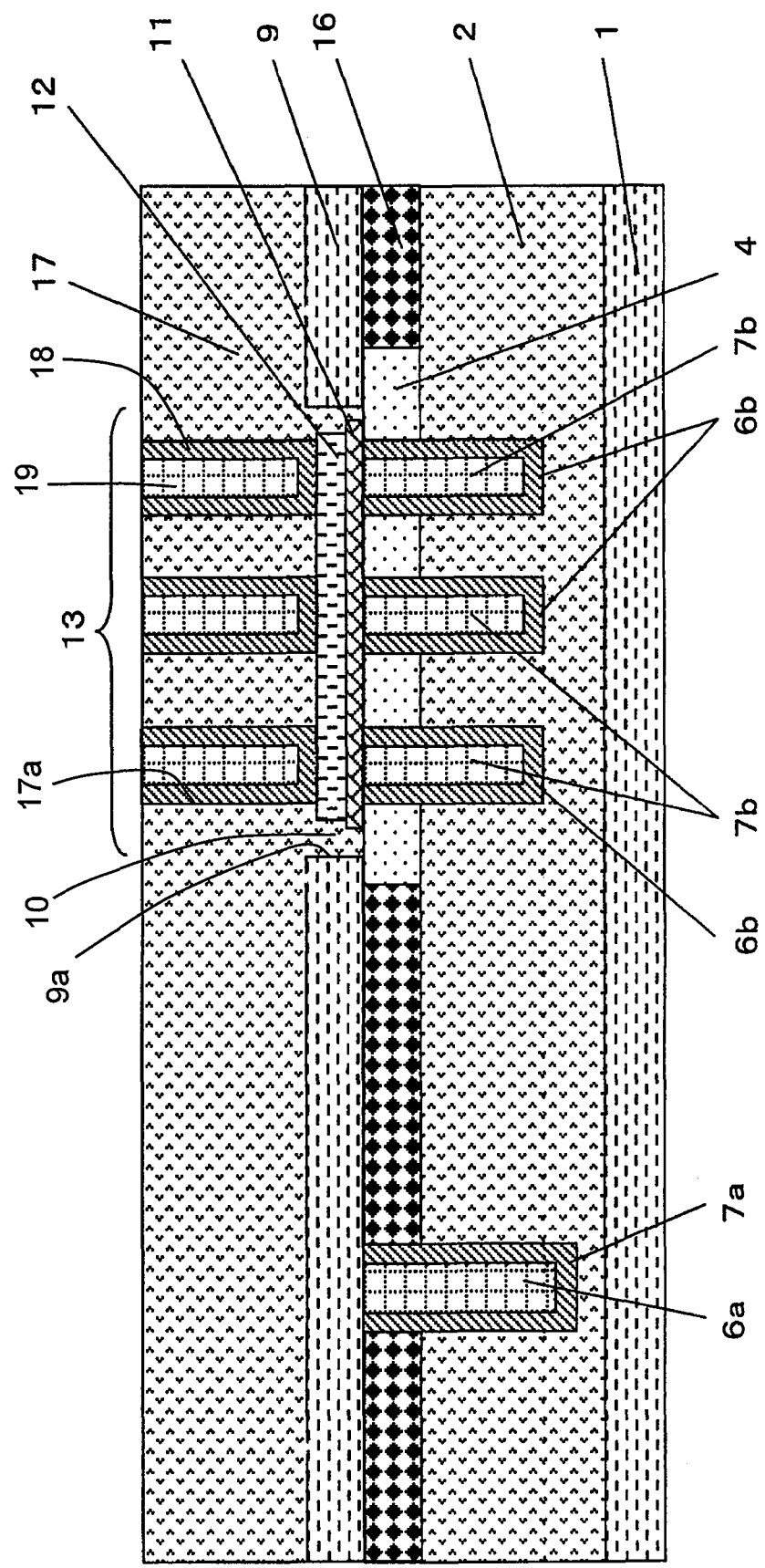
FIG. 19 is a sectional view illustrating the manufacturing process of the semiconductor device according to the preferred embodiment 2.
Figure 20:
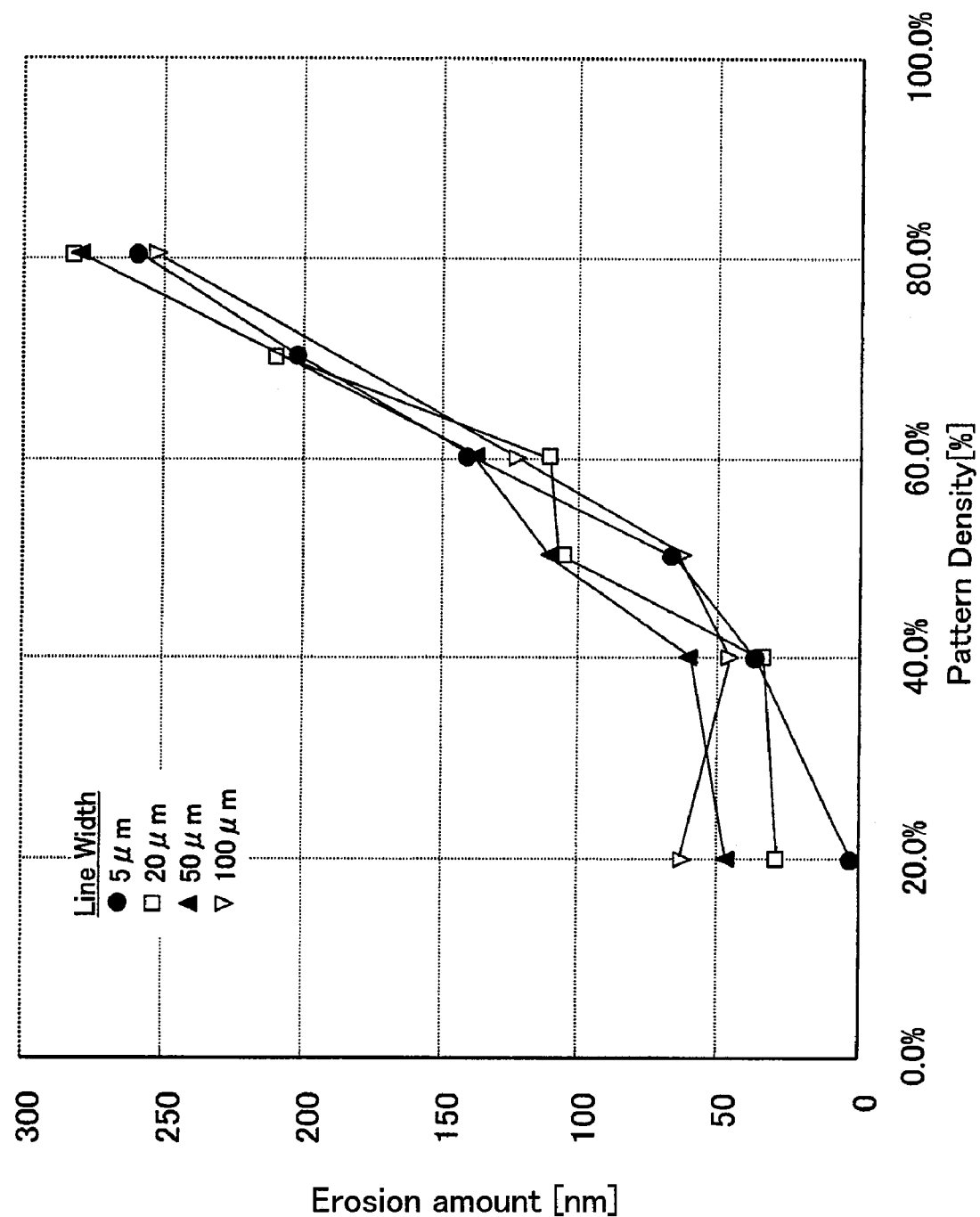
FIG. 20 is a graph illustrating a relationship between an erosion amount and a metallic wiring density according to the conventional example 2.

In the process illustrated in FIG. 19, the third metallic wirings 13 made of Cu are formed on the second conductive film 12 by means of the dual damocene process. Below is described in detail a method of forming the third metallic wirings 13.

A fourth insulation film 17 is deposited on the second insulation film 9 and the second conductive film 12, and the deposited fourth insulation film 17 is etched, so that grooves 17a are formed. The grooves 17a are located above the opening 10 and have such a depth that reaches the second conductive film 12. The grooves 17a are grooves in which the plurality of metallic wirings are densely formed. Next, a conductive film 18' having the thickness of 30 nm is formed on the entire surface of the fourth insulation film 17 including the grooves 17a. An example of the conductive film 18' is a conductive film made of Ta and TaN. After the conductive film 18' is formed, a metallic film 19' made of copper or copper alloy is deposited in the thickness of approximately 900 nm on the conductive film 18'. The conductive film 18' and the metallic film 19' are not shown in FIG. 19. Then, the metallic film 19' and the conductive film 18', except for the metallic film 19' and the conductive film 18' in the groove 17a, are polished to be removed by the CMP. Hereinafter, the metallic film 19' and the conductive film 18', which remain after the polishing process, are called a metallic film 19 and a conductive film 18, respectively. The metallic film 19 and the conductive film 18 are shown in FIG. 19.

Further, the entire surface of the fourth insulation film 17 exposed as a result of the polishing process is polished by a predetermined thickness. Accordingly, the fourth insulation film 17 is flattened, and the third metallic wirings (made of the conductive film 18 and metallic film 19) 13 are formed in the grooves 17a.

In the preferred embodiment 2, silicon oxide film is used as the third insulation film 16 and TaN is used as the first conductive film 4. However, the third insulation film 16 and the first conductive film 4 are not necessarily limited to these materials, and any other materials may be selected as far as the polishing rate of the first conductive film 4 can be set to be lower than that of the third insulation film 16 and the etching selection ratio of the first conductive film 4 can be set to be higher than that of the third insulation film 16. In the case where an FSG film is selected as the third insulation film 16, for example, a TaN film of which the polishing rate is lower than that of the FSG film and the etching selection ratio is higher that that of the FSG film can be selected as the first conductive film 4. The first conductive film 4 may be made of a metal nitride film including TiN, and the second insulation film 9 may be made of a silicon nitride-oxide film.

According to the semiconductor device and the semiconductor device manufacturing method of the preferred embodiment 2, in the high-density metallic wiring region 14 where the plurality of second metallic wirings 8b are densely formed, the first conductive film 4 of which the polishing rate is lower than that of the third insulation film 16 is formed. Therefore, the depth of the concave portion generated in the first conductive film 4 by erosion is reduced when the metallic films 7 and the conductive film 6 are polished to be removed by the CMP. More specifically, as soon as the first conducive film 4 is exposed, the polishing process is substantially halted because the polishing rate of the first conductive film 4 is lower than that of the third insulation film 16. In the high-density metallic wiring region 14, where the metallic wirings are densely formed, any further advancement of the polish for the metallic film 7 formed in the first conductive film 4 can be substantially controlled. Accordingly, the generation of a concave portion in the second metallic wiring 8b and the first conductive film 4 can be controlled, and the advancement of polishing at the third insulation film 16 (particularly, edge portion) is controlled. As a result, the occurrence of the erosion can be controlled, and the surfaces of the third insulation film 16 and the first conductive film 4 are made flush with each other (the process illustrated in FIG. 16).

In the high-density metallic wiring region 14 where the plurality of second metallic wirings are densely formed, the first conductive film 4 of which the etching selection ratio is higher than that of the third insulation film 16 is formed. Therefore, the difference in level generated between the second metallic wirings 8b and the first conductive film 4 is reduced when the opening 10 is formed in the second insulation film 9, and the surfaces of the third insulation film 16 and the first conducive film 4 are made flush with each other. As a result, the lower electrode of the MIM capacitor having a flat upper surface structure irrespective of the density of the metallic wirings can be obtained (process illustrated in FIG. 17).

Further, since the polishing rate of the first conductive film 4 is lower than that of the third insulation film 16, a concave portion conventionally generated in the first conductive film 4 by erosion when the entire surfaces of the third insulation film 16 and the first conducive film 4 are polished by the predetermined amount by the CMP is not generated, the surfaces of the first insulation film 2 and the first conductive film 4 are made flush with each other (see the process illustrated in FIG. 16). As a result, the variation of the capacitance value resulting from the deterioration of the flatness in the lower electrode can be reduced.

While there has been described what is at present considered to be preferred embodiments of this invention, it will be understood that various modifications may be made therein, and it is intended to cover in the appended claims all such modifications as fall within the true spirit and scope of this invention.

What is claimed is:

1. A semiconductor device comprising:
   a semiconductor substrate; and
   an MIM capacitor, the MIM capacitor comprising:
   a first insulation film provided on the semiconductor substrate;
   a first conductive film made of a material of which a polishing rate is lower than the polishing rate of the first insulation film and embedded in a predetermined region of the first insulation film;
   a plurality of grooves which penetrate through the first conductive film and reach the first insulation film;
   metallic wirings embedded in the respective grooves so as to be in contact with the first conductive film;
   a dielectric film provided on the metallic wirings and the first conductive film; and
   a second conductive film provided on the dielectric film, wherein the metallic wirings and the first conductive film constitute a lower electrode of the MIM capacitor, the dielectric film constitutes a dielectric layer of the MIM capacitor, and the second conductive film constitutes an upper electrode of the MIM capacitor.

2. The semiconductor device as claimed in claim 1, wherein a surface of the first conductive film and a surface of the metallic wirings are flush with a plane extended from a surface of the first insulation film.

3. The semiconductor device as claimed in claim 1, wherein the first conductive film is made of a material of which an etching selection ratio is higher than the etching selection ratio of the first insulation film.

4. The semiconductor device as claimed in claim 1, wherein the first insulation film comprises a lower insulation film and an upper insulation film, the first conductive film is provided on the predetermined region of the lower insulation film, and the upper insulation film is provided on a region other than the predetermined region of the lower insulation film.

5. The semiconductor device as claimed in claim 1, wherein a second insulation film is further provided on the first insulation film and the first conductive film, the second insulation film has an opening above the metallic wirings, and the dielectric film and the second conductive film are provided in the opening.

6. The semiconductor device as claimed in claim 5, wherein the second insulation film is made of silicon nitride or silicon nitride-oxide.

7. The semiconductor device as claimed in claim 1, wherein the dielectric film is made of silicon nitride or tantalum oxide.

8. The semiconductor device as claimed in claim 1, wherein the first conductive film is made of metal nitride including TaN or TiN.

9. The semiconductor device as claimed in claim 1, wherein the metallic wirings include copper or copper alloy as a main constituent thereof.

* * * * *